United States Patent
Lee et al.

(10) Patent No.: US 10,636,808 B2
(45) Date of Patent: Apr. 28, 2020

(54) VERTICAL MEMORY DEVICE HAVING AN EPITAXIAL LAYER IN CONTACT WITH A CHANNEL LAYER

(71) Applicant: SAMSUNG ELECTRONICS CO., LTD., Suwon-si (KR)

(72) Inventors: Kyung Hwan Lee, Hwaseong-si (KR); Yong Seok Kim, Suwon-si (KR); Tae Hun Kim, Gwacheon-si (KR); Byoung Taek Kim, Hwaseong-si (KR); Jun Hee Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/941,978

(22) Filed: Mar. 30, 2018

(65) Prior Publication Data
US 2019/0019809 A1 Jan. 17, 2019

(30) Foreign Application Priority Data

Jul. 13, 2017 (KR) .......... 10-2017-0089171

(51) Int. Cl.
*H01L 27/11582* (2017.01)
*H01L 29/423* (2006.01)
(Continued)

(52) U.S. Cl.
CPC .. *H01L 27/11582* (2013.01); *H01L 27/11524* (2013.01); *H01L 27/11556* (2013.01); *H01L 27/11573* (2013.01); *H01L 27/11575* (2013.01); *H01L 29/42348* (2013.01); *H01L 29/511* (2013.01); *H01L 29/517* (2013.01); *H01L 29/792* (2013.01)

(58) Field of Classification Search
CPC ......... H01L 27/11582; H01L 27/11556; H01L 27/11575; H01L 27/1157; H01L 27/11568; H01L 29/792; H01L 29/42348; H01L 29/7926; H01L 29/04; H01L 29/7889; H01L 29/66666; H01L 29/66833; H01L 21/28282
See application file for complete search history.

(56) References Cited

U.S. PATENT DOCUMENTS 8,482,049 B2 * 7/2013 Son .................. G11C 16/0483
257/314
9,431,417 B1 8/2016 Lai et al.
(Continued)

FOREIGN PATENT DOCUMENTS

KR   10-2013-0057670 A   6/2013
WO        2016/064530 A1   4/2016

OTHER PUBLICATIONS

Search Report and Written Opinion dated Oct. 16, 2018 by the Intellectual Property Office of Singapore in counterpart Singapore Patent Application No. 10201804989U.

*Primary Examiner* — Khiem D Nguyen
(74) *Attorney, Agent, or Firm* — Sughrue Mion, PLLC

(57) ABSTRACT

A vertical memory device and method of manufacture thereof are provided. The vertical memory device includes gate electrode layers stacked on a substrate; a channel layer penetrating through the gate electrode layers; and a first epitaxial layer in contact with a lower portion of the channel layer and including a region having a diameter smaller than an external diameter of the channel layer.

17 Claims, 23 Drawing Sheets

(51) Int. Cl.
   H01L 29/51      (2006.01)
   H01L 27/11575   (2017.01)
   H01L 27/11524   (2017.01)
   H01L 27/11556   (2017.01)
   H01L 27/11573   (2017.01)
   H01L 29/792     (2006.01)

(56) References Cited

U.S. PATENT DOCUMENTS

| | | | |
|---|---|---|---|
| 9,524,977 B2 | 12/2016 | Sharangpani et al. | |
| 9,536,970 B2 | 1/2017 | Seol et al. | |
| 9,570,460 B2 | 2/2017 | Kanakamedala et al. | |
| 2009/0283819 A1* | 11/2009 | Ishikawa | H01L 21/28282 257/324 |
| 2013/0034945 A1* | 2/2013 | Park | H01L 27/0688 438/382 |
| 2013/0134492 A1* | 5/2013 | Yang | H01L 27/1157 257/314 |
| 2014/0035026 A1 | 2/2014 | Jang et al. | |
| 2014/0054676 A1* | 2/2014 | Nam | H01L 29/7926 257/324 |
| 2014/0070300 A1* | 3/2014 | Jang | H01L 27/11565 257/324 |
| 2014/0070302 A1* | 3/2014 | Yoo | H01L 27/1157 257/324 |
| 2016/0056169 A1* | 2/2016 | Lee | H01L 27/11565 438/269 |
| 2016/0064227 A1* | 3/2016 | Go | H01L 29/495 438/585 |
| 2016/0071877 A1* | 3/2016 | Kim | H01L 27/11582 257/314 |
| 2016/0104719 A1* | 4/2016 | Jung | H01L 27/11582 257/324 |
| 2016/0118397 A1* | 4/2016 | Koka | H01L 27/11582 257/325 |
| 2016/0148947 A1* | 5/2016 | Seo | H01L 27/11582 257/324 |
| 2016/0276365 A1* | 9/2016 | Choi | H01L 27/11582 |
| 2016/0284730 A1 | 9/2016 | Koka et al. | |
| 2016/0307908 A1* | 10/2016 | Sharangpani | H01L 27/1157 |
| 2016/0307913 A1 | 10/2016 | Jiang et al. | |
| 2016/0365351 A1* | 12/2016 | Nishikawa | H01L 27/1157 |
| 2017/0025421 A1 | 1/2017 | Sakakibara et al. | |
| 2017/0054036 A1 | 2/2017 | Dorhout et al. | |
| 2017/0103997 A1* | 4/2017 | Lee | H01L 21/0243 |
| 2017/0103998 A1* | 4/2017 | Chang | H01L 21/26513 |
| 2017/0154892 A1 | 6/2017 | Oh | |

\* cited by examiner

'A'

'A'

'A'

'A'

'A'

'A'

'C'

'C'

'C'

'C'

VERTICAL MEMORY DEVICE HAVING AN EPITAXIAL LAYER IN CONTACT WITH A CHANNEL LAYER

CROSS-REFERENCE TO RELATED APPLICATION

This application claims priority to Korean Patent Application No. 10-2017-0089171, filed on Jul. 13, 2017 in the Korean Intellectual Property Office, the disclosure of which is incorporated by reference herein in its entirety.

BACKGROUND

1. Field

Apparatuses, devices, articles of manufacture and methods consistent with the present disclosure relate to a vertical memory device and manufacturing vertical memory devices.

2. Description of Related Art

Electronic products have gradually been decreased in size, while still being required to process high-capacity data. Therefore, a degree of integration in semiconductor memory devices used in electronic products is required to be increased. In order to increase the degree of integration in semiconductor memory devices, a method of manufacturing vertical memory devices in which memory cells having a vertical transistor structure are stacked, rather than a planar transistor structure of the related art, has been proposed.

SUMMARY

It is an aspect to provide a vertical memory device preventing a disconnection phenomenon of a channel layer and having improved characteristics in transistors forming a memory cell string.

According to an aspect of an example embodiment, there is provided a vertical memory device comprising a substrate; a plurality of gate electrode layers stacked on the substrate; a channel layer penetrating through the plurality of gate electrode layers; and a first epitaxial layer in contact with a lower portion of the channel layer and including a region having a diameter smaller than an external diameter of the channel layer.

According to another aspect of an example embodiment, there is provided a vertical memory device comprising a substrate; a plurality of gate electrode layers stacked on the substrate; a channel hole penetrating through the plurality of gate electrode layers; a channel layer extended in the channel hole in a vertical direction; a gate dielectric layer including a sidewall portion and a lower surface portion, the sidewall portion being disposed between the channel layer and the plurality of gate electrode layers, and the lower surface portion being bent in a lower portion of the channel hole to be disposed between the channel layer and the substrate; and a first epitaxial layer in contact with the channel layer and penetrating through the lower surface portion of the gate dielectric layer.

According to yet another aspect of an example embodiment, there is provided a vertical memory device comprising a substrate; a plurality of gate electrode layers stacked on the substrate; a channel hole penetrating through the plurality of gate electrode layers; a gate dielectric layer covering an internal sidewall of the channel hole and bent in a lower portion of the channel hole; a through hole penetrating through the gate dielectric layer in the lower portion of the channel hole; and a monocrystalline semiconductor layer filling at least a portion of the through hole.

According to yet another aspect of an example embodiment, there is provided a method of manufacturing a vertical memory device, the method comprising alternately stacking a plurality of mold insulating layers and a plurality of sacrificial layers on a substrate; forming a channel hole penetrating through the plurality of mold insulating layers and the plurality of sacrificial layers; forming a gate dielectric layer covering a side wall of the channel hole; forming a through hole in a lower portion of the channel hole by removing a portion of the gate dielectric layer; and growing a first epitaxial layer filling at least a portion of the through hole.

BRIEF DESCRIPTION OF DRAWINGS

The above and other aspects will be more clearly understood from the following detailed description, when taken in conjunction with the accompanying drawings, in which.

DETAILED DESCRIPTION

Hereinafter, example embodiments of the present inventive concept will be described with reference to the attached drawings.

Figure 1:
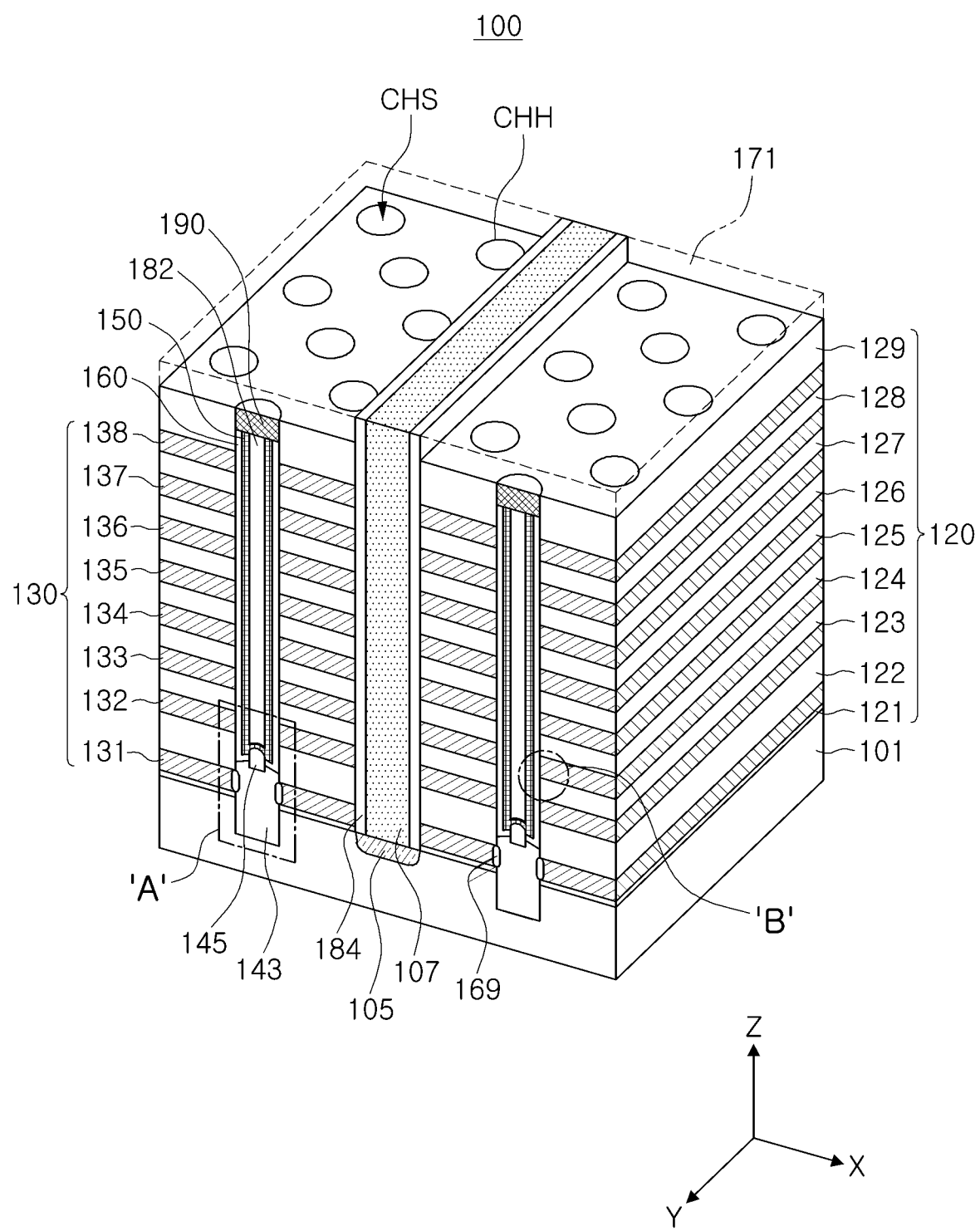
FIG. 1 is a schematic perspective view of a vertical memory device according to an example embodiment.

FIG. 1 is a schematic perspective view of a vertical memory device according to an example embodiment.

Figure 2A:
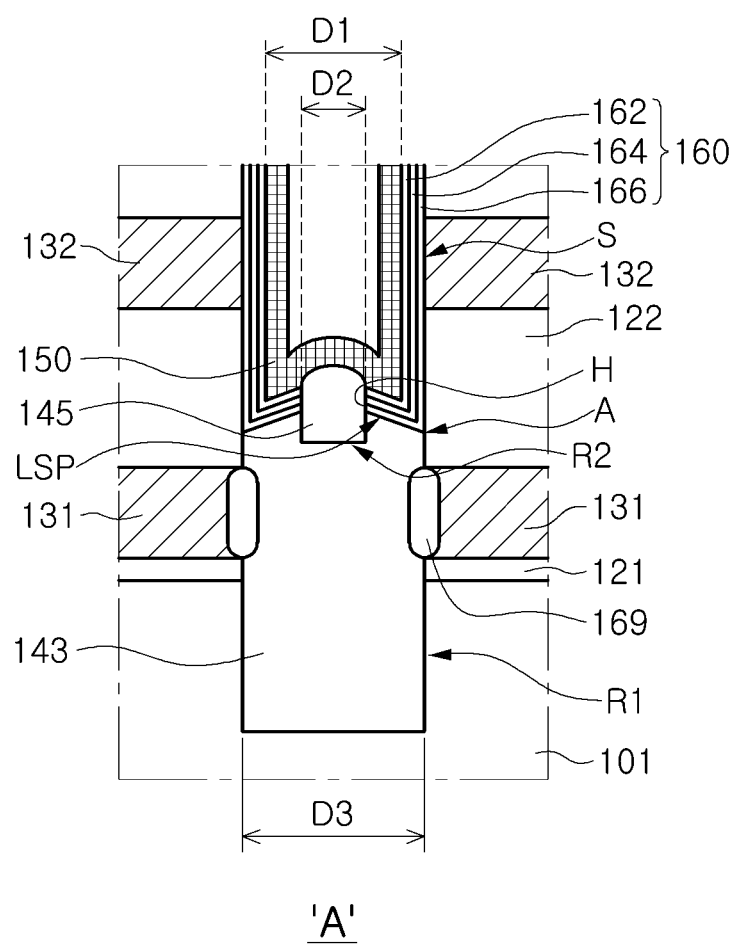
FIGS. 2A to 2G are cross-sectional views illustrating an epitaxial layer of a vertical memory device according to example embodiments and illustrate an area corresponding to area 'A' of FIG. 1.

FIG. 2A is a cross-sectional view illustrating an epitaxial layer of a vertical memory device 100 according to an example embodiment and illustrates an area corresponding to area 'A' of FIG. 1.

With reference to FIGS. 1 and 2A, the vertical memory device 100 may include a substrate 101, channel holes CHH extended in a direction perpendicular to an upper surface of the substrate 101, channel structures CHS disposed in the channels CHH, mold insulating layers 120 and gate electrode layers 130, stacked along a side wall of the channel holes. The vertical memory device 100 may include the channel holes CHH penetrating through the mold insulating layers 120 and the gate electrode layers 130, alternately stacked on the substrate 101, in the direction perpendicular to the upper surface of the substrate 101 and may include the channel structures CHS disposed in the channel holes CHH. That is, a corresponding channel structure CHS may be disposed in each of the channel holes CHH. The channel structures CHS may be disposed to be spaced apart from each other in an X direction and a Y direction. The channel structure CHS may include a channel layer 150, an upper epitaxial layer 145 in contact with a lower portion of the channel layer 150, a lower epitaxial layer 143 in contact with the upper epitaxial layer 145 and the substrate 101, a gate dielectric layer 160 interposed between the channel layer 150 and the gate electrode layers 130, and a conductive pad 190 disposed on the channel layer 150. The vertical memory device 100 may include a conductive layer 107 dividing the gate electrode layers 130 and an impurity region 105 disposed in the substrate 101 below the conductive layer 107. FIG. 1 shows one conductive layer 107 and one impurity region 105. However, it will be understood that the structure shown in FIG. 1 is only an example, and additional conductive layers 107 and corresponding impurity regions 105 may be provided. In such case, rather than dividing the vertical memory device 100 into two sections, the vertical memory device 100 may be divided into three or more sections.

The substrate 101 may have an upper surface extended in the X direction and the Y direction. The substrate 101 may include a semiconductor material, such as a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer or an epitaxial layer.

The gate electrode layers 130 and the mold insulating layers 120 may be alternately stacked on the substrate 101.

The gate electrode layers 130 may be disposed to be spaced apart from each other in a Z direction from the substrate 101. In FIG. 1, eight gate electrode layers 130 are illustrated as an example. In order to increase a memory capacity of the vertical memory device 100, the number of gate electrode layers 130 may be increased. For example, the number of gate electrode layers 130 may be several tens to hundreds.

A single channel structure CHS and the gate electrode layers 130 may form a single memory cell string. A gate electrode layer 131 disposed in a lowermost position among the gate electrode layers 130 may be extended in the Y direction to form a ground select line GSL. Gate electrode layers 137 and 138 disposed in an upper portion of the gate electrode layers 130 may be extended in the Y direction to form string select lines SSL. Gate electrode layers 132, 133, 134, 135, and 136, disposed in an intermediate position among the gate electrode layers 130 may form word lines WL.

The gate electrode layers 130 may include a metal, such as tungsten (W). In addition, a diffusion barrier layer may be disposed to surround the gate electrode layers 130. The diffusion barrier layer may include at least one of tungsten nitride (WN), tantalum nitride (TaN), and titanium nitride (TiN). In an example embodiment, the gate electrode layers 130 may include polycrystalline silicon or a metallic silicide material. The metallic silicide material may be provided as a material selected from cobalt (Co), nickel (Ni), hafnium (Hf), platinum (Pt), tungsten (W), and titanium (Ti).

The mold insulating layers 120 may be disposed to be spaced apart from each other in the Z direction and may be extended in the Y direction. The mold insulating layers 120 may include an insulating material, such as a silicon oxide or a silicon nitride.

The channel layers 150 may be extended in the channel holes CHH in a vertical direction. The channel layers 150 may penetrate through the gate electrode layers 130 and the mold insulating layers 120, in order to be extended in the direction (the Z direction) substantially perpendicular to the upper surface of the substrate 101. The channel layers 150 may be disposed to be spaced apart from each other in the X direction and in the Y direction. However, disposition of the channel layers 150 may vary, according to an example embodiment. For example, the channel layers 150 may be disposed to have a zigzag form. The channel layer 150 may include a semiconductor material, such as polycrystalline silicon and/or monocrystalline silicon. In addition, the semiconductor material may be provided as an undoped material, or a material including a p-type or an n-type impurity. Respective channel layers 150 may have a macaroni shape.

For each channel structure CHS, an interior of the channel layer 150 may be filled with a first insulating layer 182.

For each channel structure CHS, gate dielectric layers 160 may be disposed between the gate electrode layers 130 and the channel layer 150 and extended between the channel layer 150 and the substrate 101, an example of which is shown in FIG. 2A. Respective gate dielectric layers 160 may include a sidewall portion S covering an internal sidewall of the channel hole CHH and interposed between the gate electrode layers 130 and the channel layer 150 and may include a lower surface portion LSP bent in a lower portion of the channel hole CHH and interposed between the channel layer 150 and the substrate 101. An angle A of the bent of the gate dielectric layer 160 may be provided at an acute angle. The lower surface portion of the gate dielectric layers 160 may have a through hole H that penetrates through the gate dielectric layers 160. A lower surface portion of the gate dielectric layers 160 may have a "L"-shaped cross section. The gate dielectric layer 160 may include a tunneling layer 162, a charge storage layer 164, and a blocking layer 166, sequentially stacked from the channel layer 150. In the case of the gate dielectric layer 160 of an example embodiment, an entirety of the tunneling layer 162, the charge storage layer 164, and the blocking layer 166 may be extended along the channel layer 150 in a vertical direction. Relative thicknesses of the tunneling layer 162, the charge storage layer 164, and the blocking layer 166, forming the gate dielectric layer 160, are not limited to an example embodiment illustrated therein and may be variously changed.

For example, the tunneling layer 162 may include a silicon oxide. The charge storage layer 164 may be provided as a charge trapping layer or a floating gate conductive layer. For example, the charge storage layer 164 may include a silicon nitride. The charge storage layer 164 may comprise an insulating material including a quantum dot or a nanocrystal. In this case, the quantum dot or the nanocrystal may include a conductive material, such as fine particles of a metal or a semiconductor.

The blocking layer 166 may include a silicon oxide ($SiO_2$), a silicon nitride ($Si_3N_4$), a silicon oxynitride (SiON), a high-k dielectric material or combinations thereof. The high-k dielectric material may be provided as one of aluminum oxide ($Al_2O_3$), tantalum oxide ($Ta_2O_3$), titanium dioxide ($TiO_2$), yttrium oxide ($Y_2O_3$), zirconium dioxide ($ZrO_2$), zirconium silicate ($ZrSi_xO_y$), hafnium oxide ($HfO_2$), hafnium silicate ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The channel layer 150 may be electrically connected to the substrate 101 by an upper epitaxial layer 145 and a lower epitaxial layer 143. In an example embodiment, the upper epitaxial layer 145 may be referred to as a first epitaxial layer, while the lower epitaxial layer 143 may be referred to as a second epitaxial layer.

The upper epitaxial layer 145 may be in contact with the lower portion of the channel layer 150 and may have a diameter D2, smaller than an external diameter D1 of the channel layer 150. The upper epitaxial layer 145 may fill the through hole H that penetrates through the lower surface portion of the gate dielectric layer 160. The upper epitaxial layer 145 may penetrate through the gate dielectric layer 160 in the lower portion of the channel hole CHH and may have an upper surface that protrudes beyond an upper surface of the gate dielectric layer 160 (i.e., in the Z direction). An upper surface of the upper epitaxial layer 145 may have an upwardly convex curved surface. The upper epitaxial layer 145 may have a lower surface protruding beyond a lower surface of the gate dielectric layer 160 (i.e., in the –Z direction). The lower surface of the upper epitaxial layer 145 may have a flat surface.

As such, the upper epitaxial layer 145 may be formed to fill the through hole H of the gate dielectric layer 160, thereby preventing a disconnection phenomenon of the channel layer 150 formed using a polycrystalline semiconductor. Thus, a structure described above may allow a thickness of the channel layer 150 to be reduced.

The lower epitaxial layer 143 may be disposed between the channel layer 150 and the substrate 101 and may be in electrical contact with the channel layer 150 and the substrate 101. The lower epitaxial layer 143 may be disposed on a recessed region R1 of the substrate 101. The lower epitaxial layer 143 may fill the recessed region R1 and may be extended above the upper surface of the substrate 101, as shown in FIG. 2A. For example, an upper surface of the lower epitaxial layer 143 may be disposed to be higher than an upper surface of a lowermost gate electrode layer 131 and may be disposed to be lower than a lower surface of the gate electrode layer 132, in the Z direction. The upper surface of the lower epitaxial layer 143 may have a convex central portion and inclined surfaces.

An upper portion of the lower epitaxial layer 143 may include a recessed region R2 in contact with a lower portion of the upper epitaxial layer 145. A form of the lower portion of the upper epitaxial layer 145 may be determined by a form of the recessed region R2 formed in the upper portion of the lower epitaxial layer 143, as will be discussed later.

The lower epitaxial layer 143 may be provided as a monocrystalline semiconductor layer formed using a selective epitaxial growth (SEG) process. The lower epitaxial layer 143 may include a lattice defect. The lower epitaxial layer 140 may include Si, Ge, or SiGe, doped with an impurity or undoped.

An insulating layer 169 may be disposed between the lower epitaxial layer 143 and the gate electrode layer 131. The insulating layer 169 may be provided as an oxide formed in such a manner that a portion of the lower epitaxial layer 143 is oxidized. For example, the insulating layer 169 may be provided as silicon oxide ($SiO_2$).

The conductive pad 190 may be disposed so as to cover an upper surface of the first insulating layer 182 and to be electrically connected to the channel layer 150. In detail, the conductive pad 190 may include doped polycrystalline silicon. The conductive pad 190 may be electrically connected to a bit line through a contact plug.

The impurity region 105 may be disposed adjacent to the upper surface of the substrate 101, extended in the Y direction, and arranged to be spaced apart from each other in the X direction.

The conductive layer 107 may be disposed on the impurity region 105 to be extended along the impurity region 105 in the Y direction. The conductive layer 107 may include a conductive material. For example, the conductive layer 107 may include W, aluminum (Al), or copper (Cu). The conductive layer 107 may be electrically isolated from the gate electrode layers 130 by a second insulating layer 184.

FIGS. 2B, 2C, 2D, 2E, 2F, and 2G are cross-sectional views illustrating epitaxial layers 143 and 145 according to example embodiments and illustrate areas corresponding to an area 'A' of FIG. 1. Only descriptions of FIGS. 2B, 2C, 2D, 2E, 2F, and 2G, different from previously provided descriptions of FIG. 2A, will be provided.

Figure 2B:
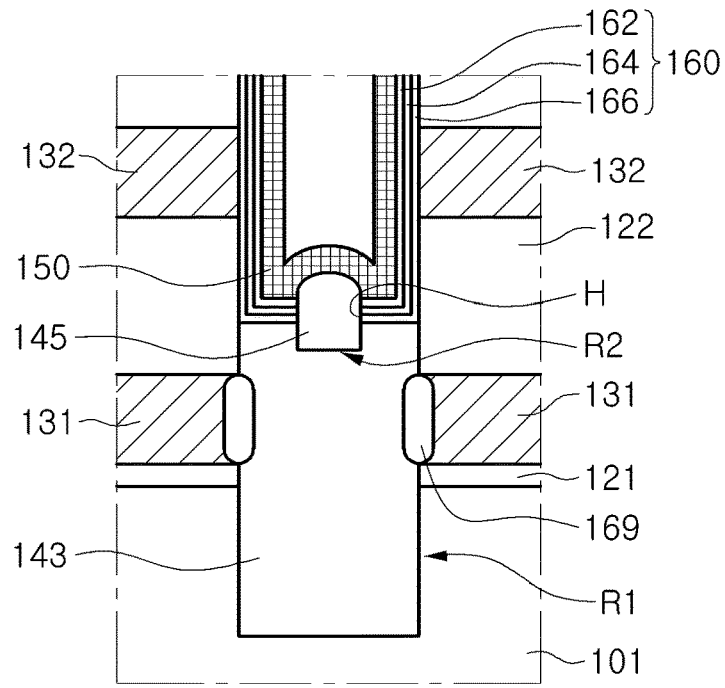

With reference to FIG. 2B, in a manner different from an example embodiment of FIG. 2A, an upper surface of a lower epitaxial layer 143 may have a horizontal surface (a flat surface), rather than inclined surfaces. Accordingly, a bent angle of a gate dielectric layer 160 may be greater than a bent angle of the gate dielectric layer 160 of FIG. 2A. The bent angle of the gate dielectric layer 160 of FIG. 2A may be an acute angle, while the bent angle of the gate dielectric layer 160 in an example embodiment may be, for example, 90°.

Figure 2C:
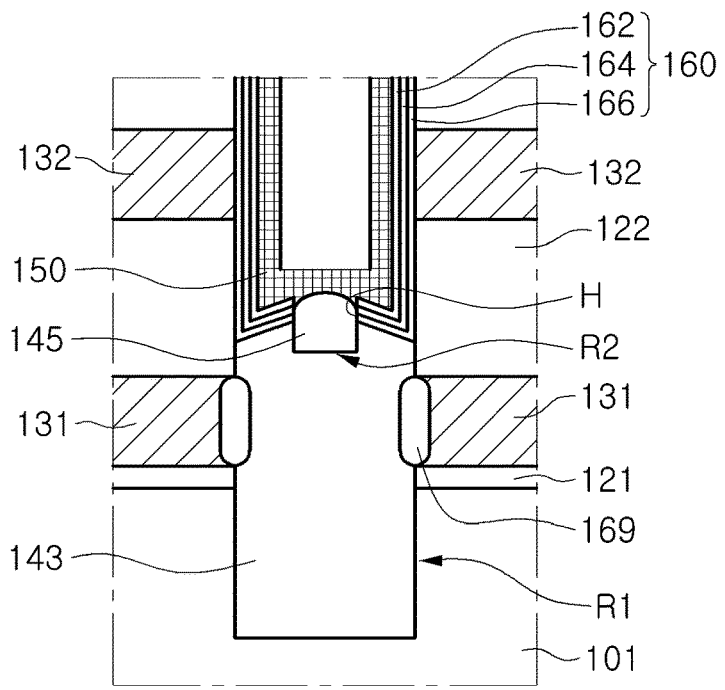

With reference to FIG. 2C, in a manner different from an example embodiment of FIG. 2A, an upper epitaxial layer 145 may fill only a portion of the through hole H of the gate dielectric layer 160. The remainder of space of the through hole H may be filled with a channel layer 150. The channel layer 150 may cover an upper surface of the upper epitaxial layer 145. The channel layer 150 may be in contact with the upper epitaxial layer 145 in the through hole H.

Figure 2D:
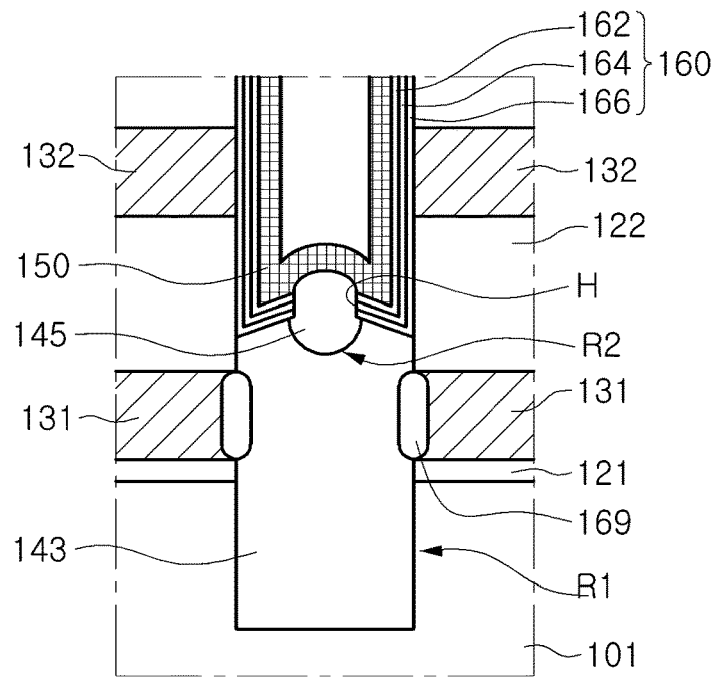

With reference to FIG. 2D, in a manner different from an example embodiment of FIG. 2A, a lower surface of the upper epitaxial layer 145 may have a downwardly convex curved surface. In other words, an upper portion of the lower epitaxial layer 143 may include a recessed region R2 in contact with the upper epitaxial layer 145 and having a concave curved surface. A diameter (a width) of an upper portion of the recessed region R2 in the lower epitaxial layer 143 may be greater than a diameter (a width) of the through hole H.

Figure 2E:
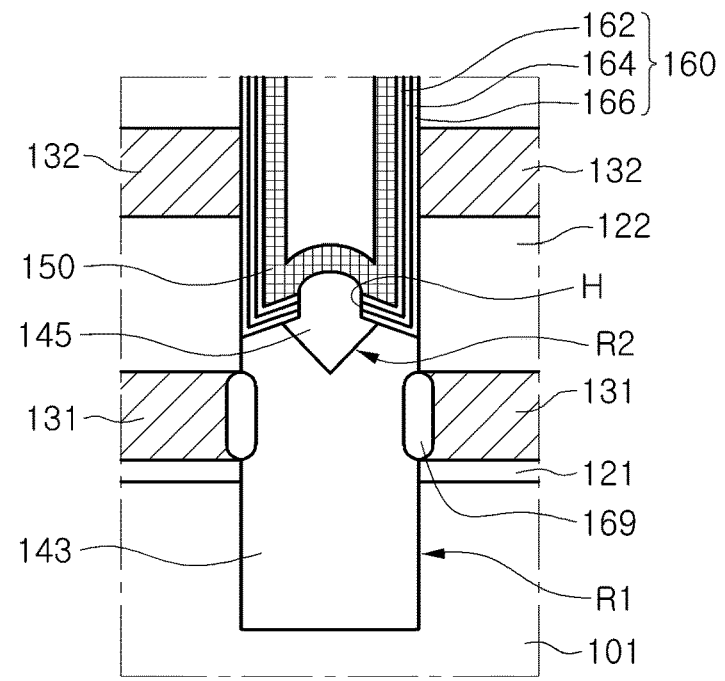

With reference to FIG. 2E, in a manner different from an example embodiment of FIG. 2A, a lower surface of the upper epitaxial layer 145 may be downwardly convex and have inclined surfaces. The lower surface of the upper epitaxial layer 145 may have a downwardly pointed cross section (e.g., an arrowhead-shaped cross section). In other words, the upper portion of the lower epitaxial layer 143 may include the recessed region R2 in contact with the upper epitaxial layer 145 and having concave curved surfaces. The diameter (the width) of the upper portion of the recessed region R2 in the epitaxial layer 143 may be greater than the diameter (the width) of the through hole H.

Figure 2F:
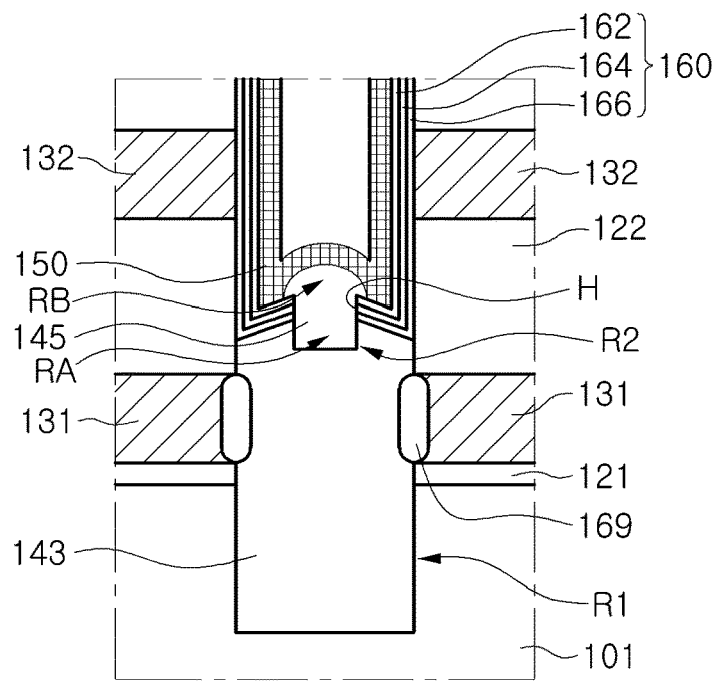

With reference to FIG. 2F, in a manner different from FIG. 2A, the upper epitaxial layer 145 may include a first region RA penetrating through the gate dielectric layer 160 and a second region RB disposed on the first region and having a diameter (a width) greater than a diameter (a width) of the first region. An upper surface of the second region of the upper epitaxial layer 145 may have an upwardly convex curved surface.

Figure 2G:
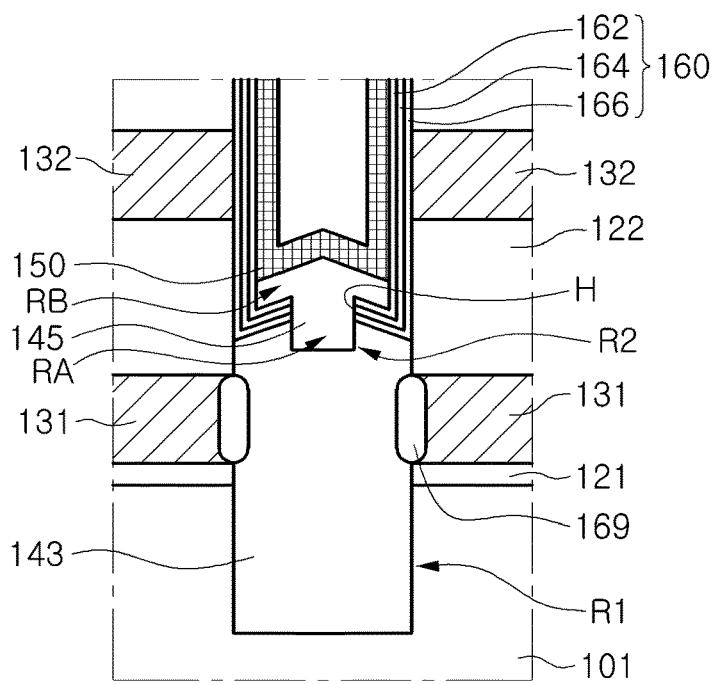

With reference to FIG. 2G, in a manner different from an example embodiment of FIG. 2A, the upper epitaxial layer 145 may include a first region RA penetrating through the gate dielectric layer 160 and a second region RB disposed on the first region and having the diameter (the width) greater than the diameter (the width) of the first region. The second region may be in contact with a sidewall portion of the gate dielectric layer 160. The upper surface of the second region of the upper epitaxial layer 145 may be upwardly convex and have inclined surfaces.

Example embodiments of FIGS. 2A to 2G may be appropriately combined with each other.

Figure 3A:
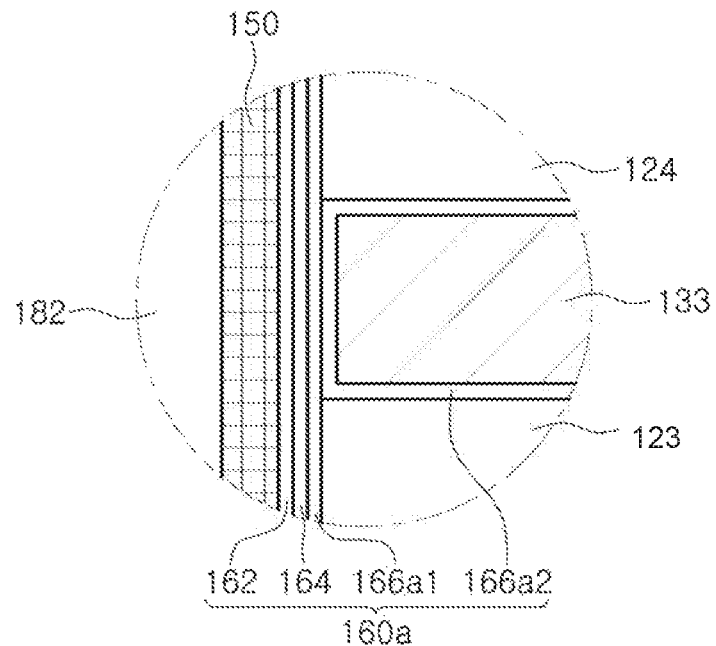
FIGS. 3A and 3B are cross-sectional views illustrating a gate electrode layer of a vertical memory device according to example embodiments and illustrate an area corresponding to area 'B' of FIG. 1.
Figure 3B:
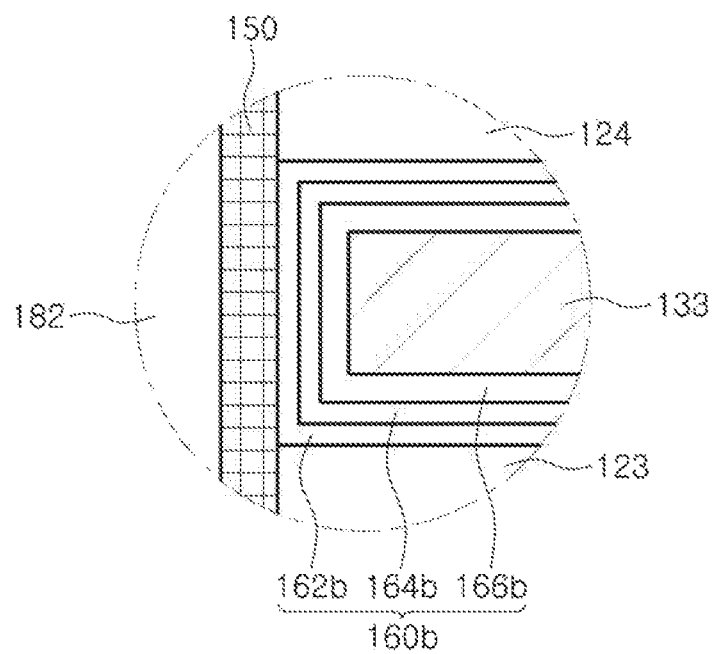

FIGS. 3A and 3B are cross-sectional views illustrating a gate dielectric layer of a vertical memory device according to example embodiments and illustrate an area corresponding to area 'B' of FIG. 1.

FIGS. 3A and 3B illustrate a gate electrode layer 133, a diffusion barrier layer 170, a gate dielectric layer 160a, a channel layer 150, and a first insulating layer 182.

With reference to FIG. 3A, the gate dielectric layer 160a may include a tunneling layer 162, a charge storage layer 164, and a first blocking layer 166a1 and a second blocking layer 166a2, sequentially stacked in a direction away from the channel layer 150. Relative thicknesses of each of the tunneling layer 162, the charge storage layer 164, the first blocking layer 166a1 and the second blocking layer 166a2, described above, forming the gate dielectric layer 160 are not limited to an example embodiment illustrated therein and may be variously changed.

The gate dielectric layer 160a may be different from example embodiments of FIGS. 1 and 2A in that the first blocking layer 166a1 is vertically extended in the same manner as the channel layer 150, and the second blocking layer 166a2 is disposed to surround the gate electrode layer 133. In detail, the second blocking layer 166a2 may include a material having a dielectric constant higher than that of the first blocking layer 166a1.

With reference to FIG. 3B, a gate dielectric layer 160b may have a structure in which a tunneling layer 162b, a charge storage layer 164b, and a blocking layer 166b are sequentially stacked from the channel layer 150. The gate dielectric layer 160b of an example embodiment may be different from an example embodiment of FIGS. 1 and 2A in that an entirety of the tunneling layer 162b, the charge storage layer 164b, and the blocking layer 166b are disposed to surround the gate electrode layer 133.

FIGS. 4 to 11 are schematic views of operations of a method of manufacturing a vertical memory device 100 according to an example embodiment. FIGS. 4 to 11 may illustrate an area corresponding to a cross section taken along line X-Z of a perspective view of FIG. 1.

Figure 4:
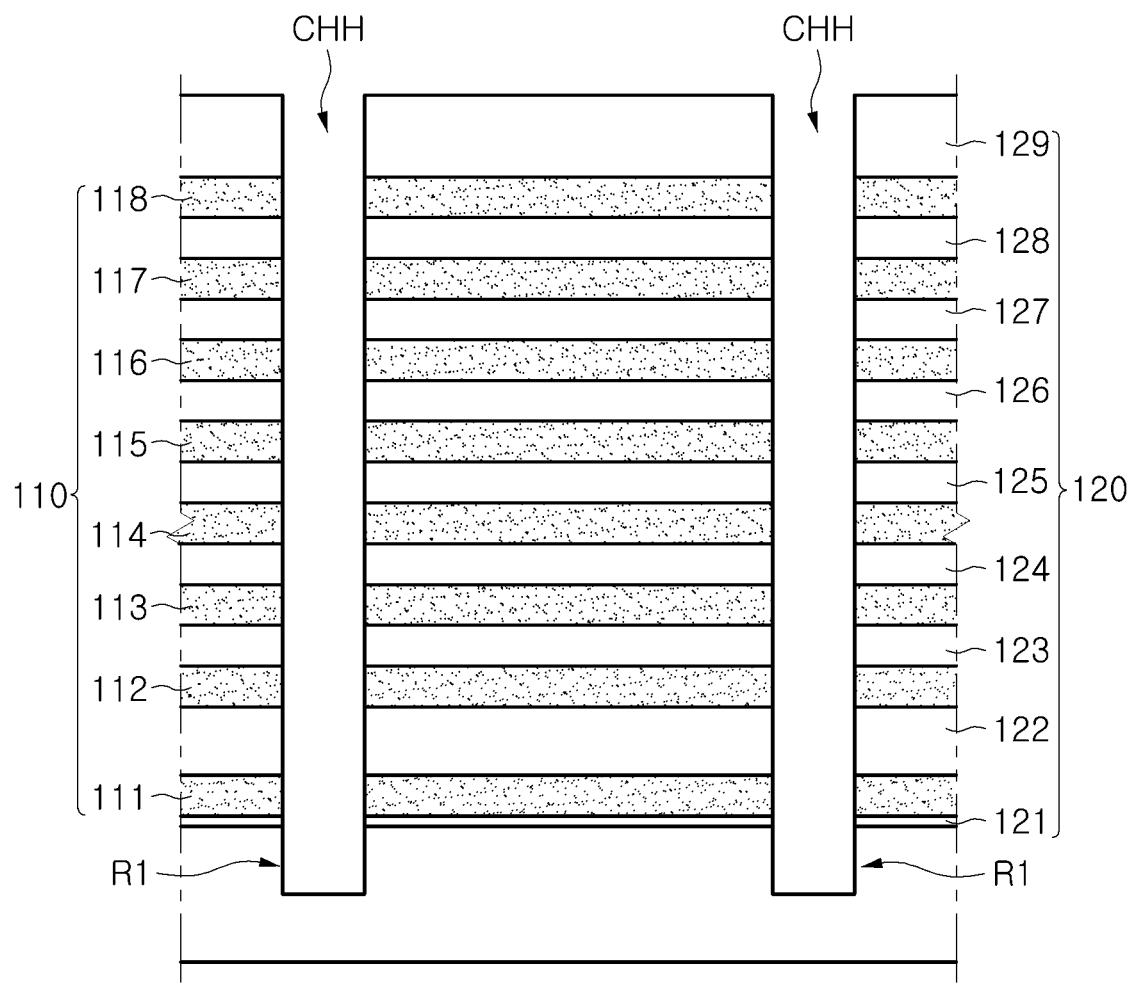
FIGS. 4 to 11 are schematic views of operations of a method of manufacturing a vertical memory device according to an example embodiment.

With reference to FIG. 4, sacrificial layers 110 and mold insulating layers 120 may be alternately stacked on a substrate 101. The mold insulating layers 120 and the sacrificial layers 110 may be alternately stacked on the substrate 101, starting from a mold insulating layer 121, as illustrated therein.

The sacrificial layers 110 may be formed using a material having etching selectivity with respect to the mold insulating layers 120. For example, the mold insulating layers 120 may be formed using at least one of a silicon oxide and a silicon nitride. The sacrificial layers 110 may be formed using a material selected from a group consisting of Si, a silicon oxide, a silicon carbide, and a silicon nitride, different from the mold insulating layers 120.

As illustrated therein, thicknesses of the mold insulating layers 120 in an example embodiment may not be equal. A lowermost mold insulating layer 121 among the mold insulating layers 120 may be formed to be relatively thin, while an uppermost mold insulating layer 129 among the mold insulating layers 120 may be formed to be relatively thick. In addition, mold insulating layers 122 and 127 may be formed to be relatively thicker than mold insulating layers 123 to 126. However, thicknesses of the mold insulating layers 120 and the sacrificial layers 110 may be variously changed, in a manner different from those illustrated therein. The number of layers forming the mold insulating layers 120 and the sacrificial layers 110 may also be variously changed.

Subsequently, channel holes CHH penetrating through the sacrificial layers 110 and the mold insulating layers 120 may be formed.

The channel holes CHH may be extended to the substrate 101 in a Z direction so that a recessed region R1 may be formed in the substrate 101. The channel holes CHH may be formed in such a manner that the sacrificial layers 110 and the mold insulating layers 120 are anisotropically etched. In some example embodiments, a side wall of the channel holes CHH may not be disposed in a direction perpendicular to an upper surface of the substrate 101. For example, a diameter (a width) of the channel holes CHH may be reduced in a direction of the upper surface of the substrate 101. As another example, a diameter (a width) of the channel holes CHH may be reduced gradually from a upper layer 129 toward a bottom surface of the region R1 in the substrate 101.

Figure 5:
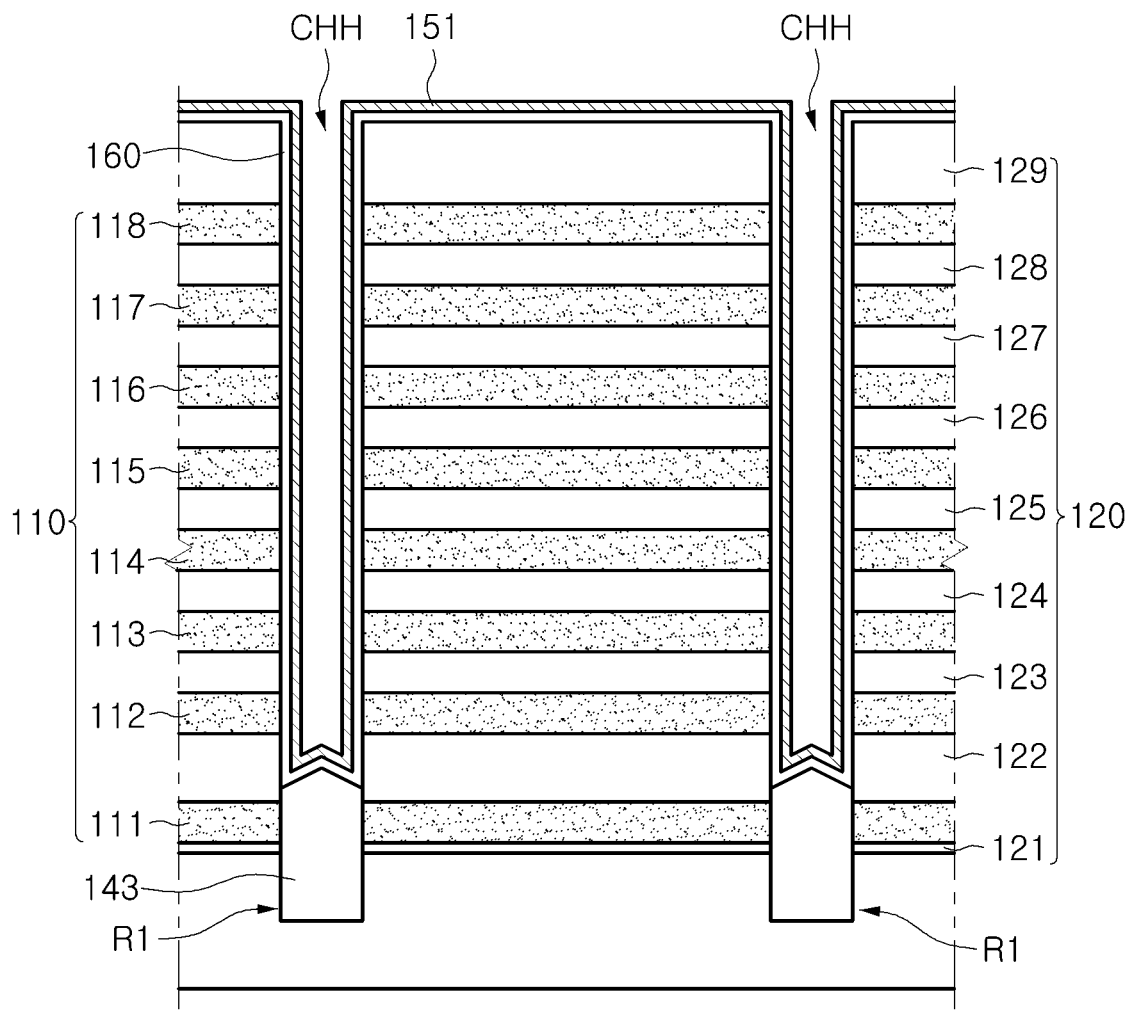

With reference to FIG. 5, a lower epitaxial layer 143 may be formed on a recessed region R1 in a lower portion of the channel holes CHH.

The lower epitaxial layer 143 may be formed in such a manner that an SEG process is performed using the substrate 101 in the recessed region R1 as a seed. The lower epitaxial layer 143 may be formed to have a single layer structure or a multilayer structure including different growth conditions or compositions.

The lower epitaxial layer 143 may be doped with an impurity. The impurity may be provided as a conductive impurity the same as that in the substrate 101 or opposed thereto.

An upper surface of the lower epitaxial layer 143 may be formed to be higher than an upper surface of a sacrificial layer 111 disposed adjacent to the substrate 101. In addition, the upper surface of the lower epitaxial layer 143 may be formed to have a convex shape in an opposite direction to the substrate 101. However, the upper surface of the lower epitaxial layer 143 may be formed to have a flat shape, depending on growth conditions, or the like.

Subsequently, a gate dielectric layer 160 and a sacrificial semiconductor layer 151 may be formed in the channel holes CHH.

The gate dielectric layer 160 may be formed on a side wall of the channel holes CHH, the upper surface of the lower epitaxial layer 143, and an upper surface of the mold insulating layer 129 to have a uniform thickness. The gate dielectric layer 160 may include a blocking layer, a charge storage layer, and a tunneling layer, sequentially formed.

The sacrificial semiconductor layer 151 may be formed on the gate dielectric layer 160 to have a uniform thickness. The sacrificial semiconductor layer 151 may be formed using a semiconductor material, such as polycrystalline silicon and amorphous silicon. For example, the sacrificial semiconductor layer 151 may be provided as polycrystalline silicon.

The gate dielectric layer 160 and the sacrificial semiconductor layer 151 may be formed using an atomic layer deposition (ALD) method or a chemical vapor deposition (CVD) method.

Figure 6:
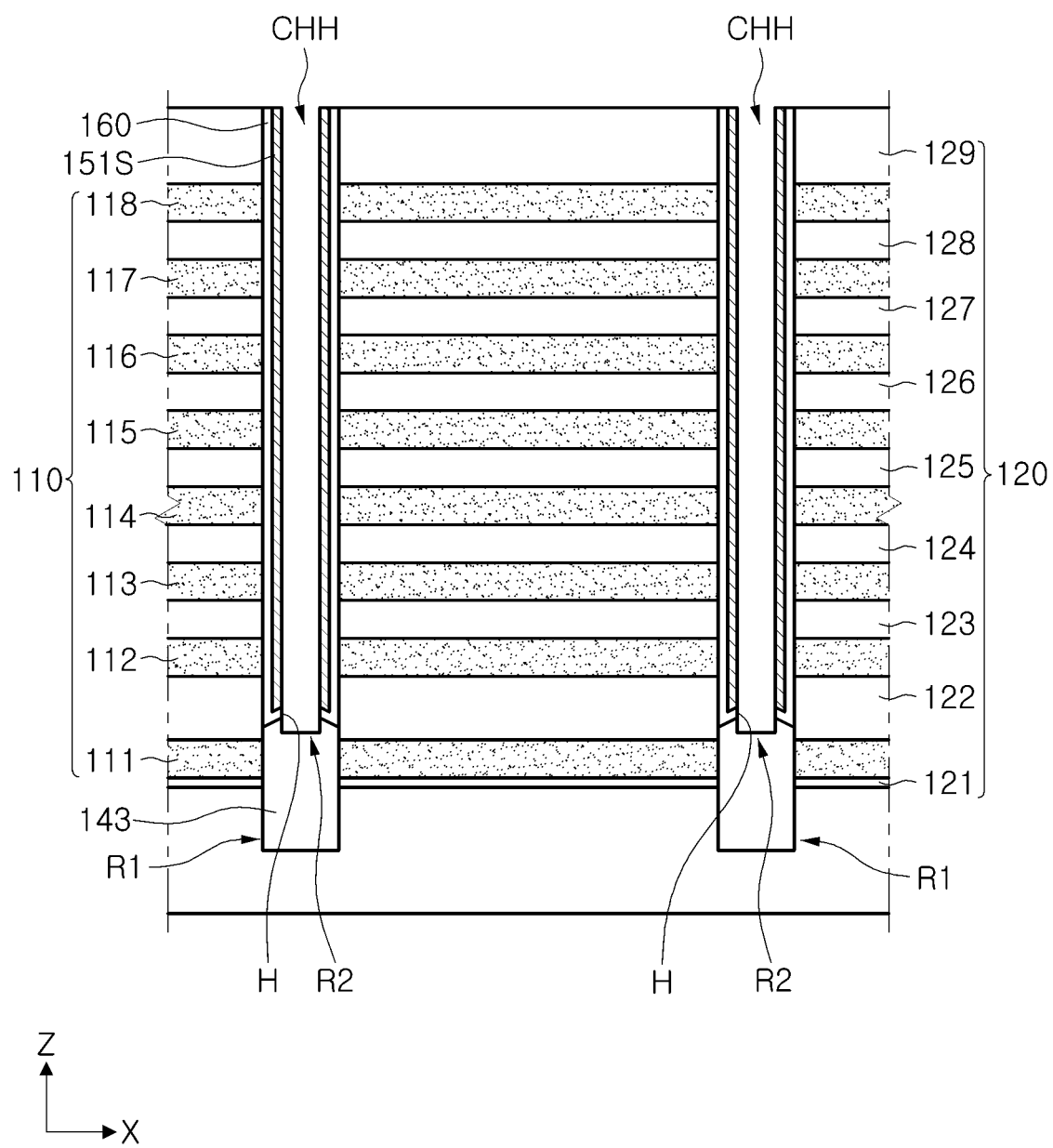

With reference to FIG. 6, in order to allow a channel layer 150 to be in direct contact with the lower epitaxial layer 143 in a subsequent process, a portion of the gate dielectric layer 160 may be removed from the channel holes CH, thereby forming through holes H.

First, a sacrificial spacer layer 151S may be formed on a side wall of the gate dielectric layer 160 in such a manner that the sacrificial semiconductor layer 151 is anisotropically etched. The sacrificial spacer layer 151S may allow a portion of the gate dielectric layer 160 formed on the upper surface of the lower epitaxial layer 143 to be exposed in a lower portion of the channel hole CHH.

Subsequently, the gate dielectric layer 160 having been exposed may be selectively removed in such a manner that the gate dielectric layer 160 is anisotropically etched using the sacrificial spacer layer 151S as an etching mask. In the meantime, during an anisotropic etching process, the gate dielectric layer 160 disposed below the sacrificial spacer layer 151S may not be etched. Thus, the gate dielectric layer 160 may have a "L"-shaped cross section on the side wall of the channel hole CHH.

When the gate dielectric layer 160 is etched, a portion of the lower epitaxial layer 143 may be etched together. A recessed region R2 may be formed in an upper portion of the lower epitaxial layer 143.

Figure 7:
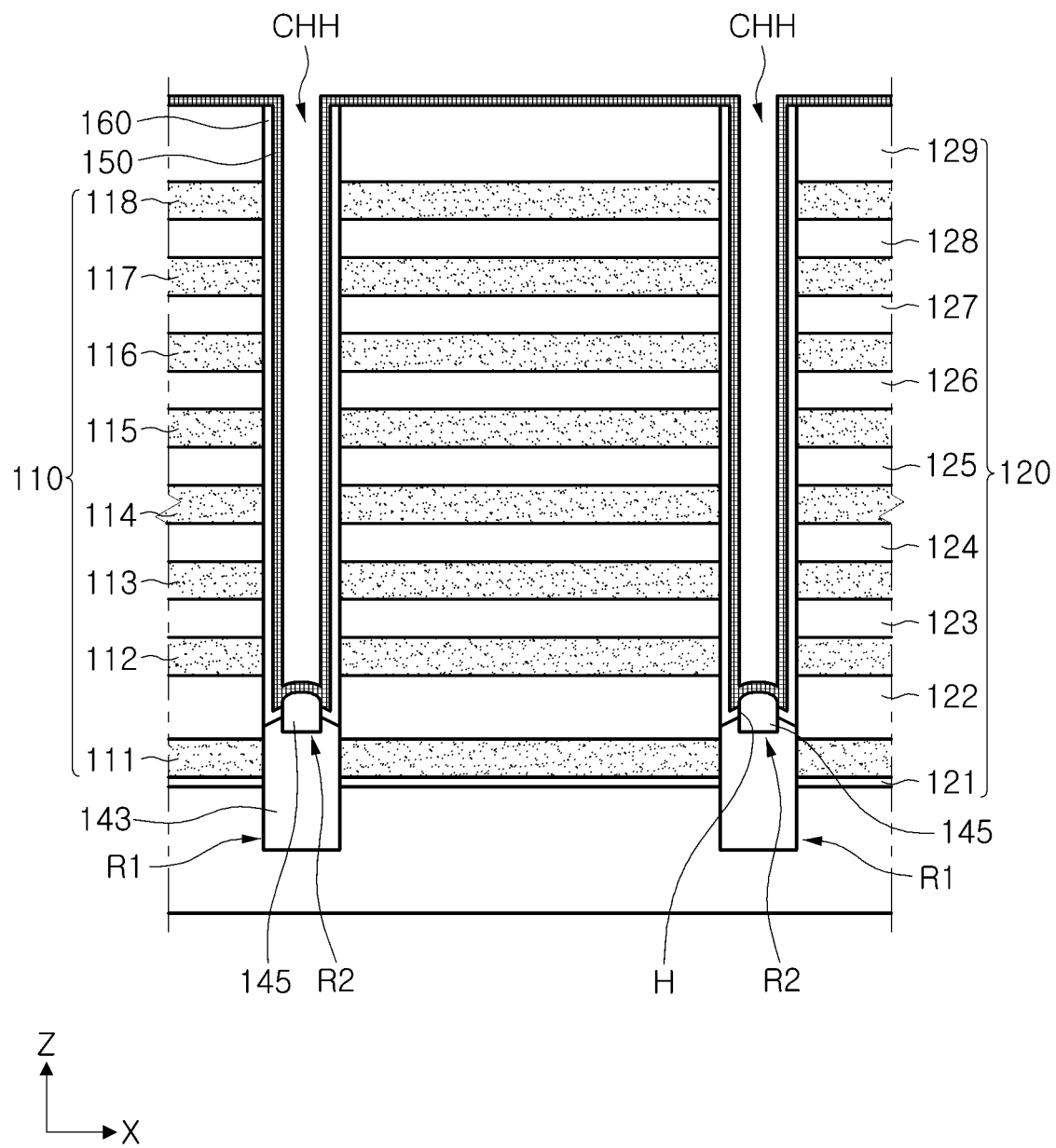

With reference to FIG. 7, an upper epitaxial layer 145 may be formed on the recessed region R2 in a lower portion of the channel holes CHH.

First, the sacrificial spacer layer 151S may be removed using a wet etching process. The upper epitaxial layer 145 may be formed in such a manner that the SEG process is performed using the lower epitaxial layer 143 in the recessed region R2 as a seed. The upper epitaxial layer 145 may be formed to have a single layer structure or a multilayer structure including different growth conditions or compositions.

The upper epitaxial layer 145 may be doped with an impurity. The impurity may be provided as a conductive impurity the same as that in the substrate 101 or opposed thereto.

An upper surface of the upper epitaxial layer 145 may entirely fill the through hole H of the gate dielectric layer 160. In addition, the upper surface of the upper epitaxial layer 145 may be formed to have a convex shape in the opposite direction to the substrate 101. Alternatively, in some example embodiments, the upper surface of the upper epitaxial layer 145 may fill only a portion of the through hole H of the gate dielectric layer 160, as discussed above.

Subsequently, the channel layer 150 may be formed in the channel holes CHH.

The channel layer 150 may be formed on the gate dielectric layer 160 to have a uniform thickness using the ALD method or the CVD method. The channel layer 150 may be formed using a semiconductor material, such as polycrystalline silicon and amorphous silicon.

The channel layer 150 may cover the upper surface of the upper epitaxial layer 145.

In a case in which the channel layer 150 is formed using polycrystalline silicon, the channel layer 150 may be formed to be thicker than an ultimately desired thickness, and then may be adjusted to have the ultimately desired thickness using a trimming process. The trimming process may be performed precisely using a solution, such as standard clean 1 (SC1) solution. The SC1 solution refers to a solution in which deionized water, $NH_4OH$, and $H_2O_2$ are mixed.

Figure 8:
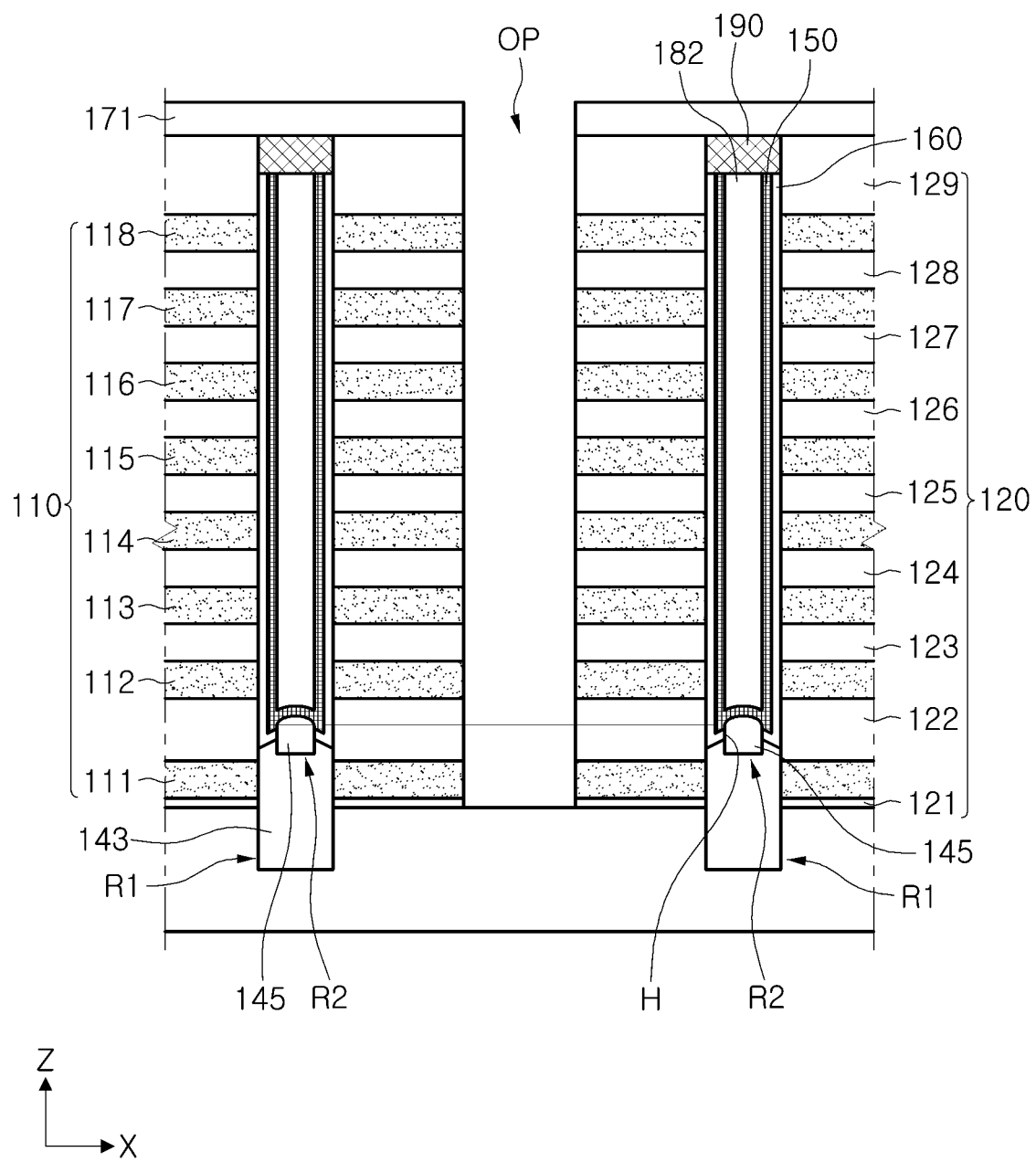

With reference to FIG. 8, a first insulating layer 182 filling the channel holes CHH and a conductive pad 190 on the first insulating layer 182 may be formed. The first insulating layer 182 may be provided as an insulating material. The conductive pad 190 may be provided as a doped semiconductor material.

Subsequently, an opening OP dividing laminates of the sacrificial layers 110 and the mold insulating layers 120 may be formed. An insulating layer 171 may be further formed on the uppermost mold insulating layer 129 and the conductive pad 190 before the opening OP is formed. The insulating layer 171 may prevent damage to the conductive pad 190 and the channel layer 150 during a subsequent process. The opening OP may be formed in such a manner that a mask layer is formed using a photolithography process, and the sacrificial layers 110 and the mold insulating layers 120 are anisotropically etched. The opening OP may be formed to have a trench form extended in the Y direction (see FIG. 1). The opening OP may allow the substrate 101 to be exposed between the channel layers 150.

Figure 9:
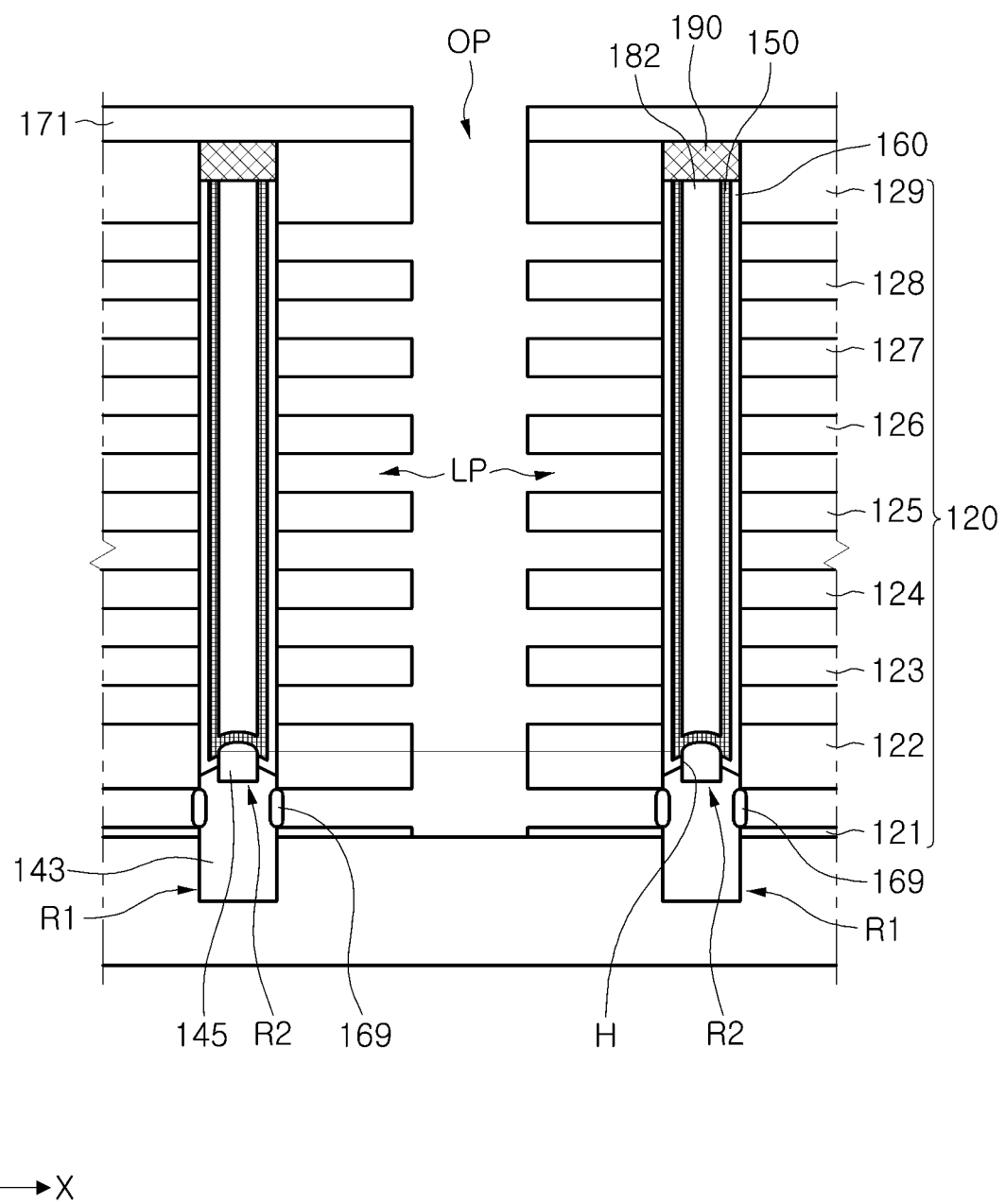

With reference to FIG. 9, the sacrificial layers 110 exposed through the opening OP may be removed using the wet etching process, thereby forming a plurality of lateral openings LP between the mold insulating layers 120. Through the lateral openings LP, a portion of side walls of the gate dielectric layer 160 and the lower epitaxial layer 143 may be exposed. In a case in which the sacrificial layers 110 are a silicon nitride, and the mold insulating layers 120 are a silicon oxide, the wet etching process may be performed using a phosphoric acid solution.

Subsequently, an insulating layer 169 may be formed on a side wall of the lower epitaxial layer 143 exposed through the lateral openings LP.

The insulating layer 169 may be formed, for example, using an oxidation process. In this case, the insulating layer 169 may be provided as an oxide film formed in such a manner that a portion of the lower epitaxial layer 143 is oxidized. A thickness and a form of the insulating layer 169 are not limited to an example embodiment illustrated therein.

Figure 10:
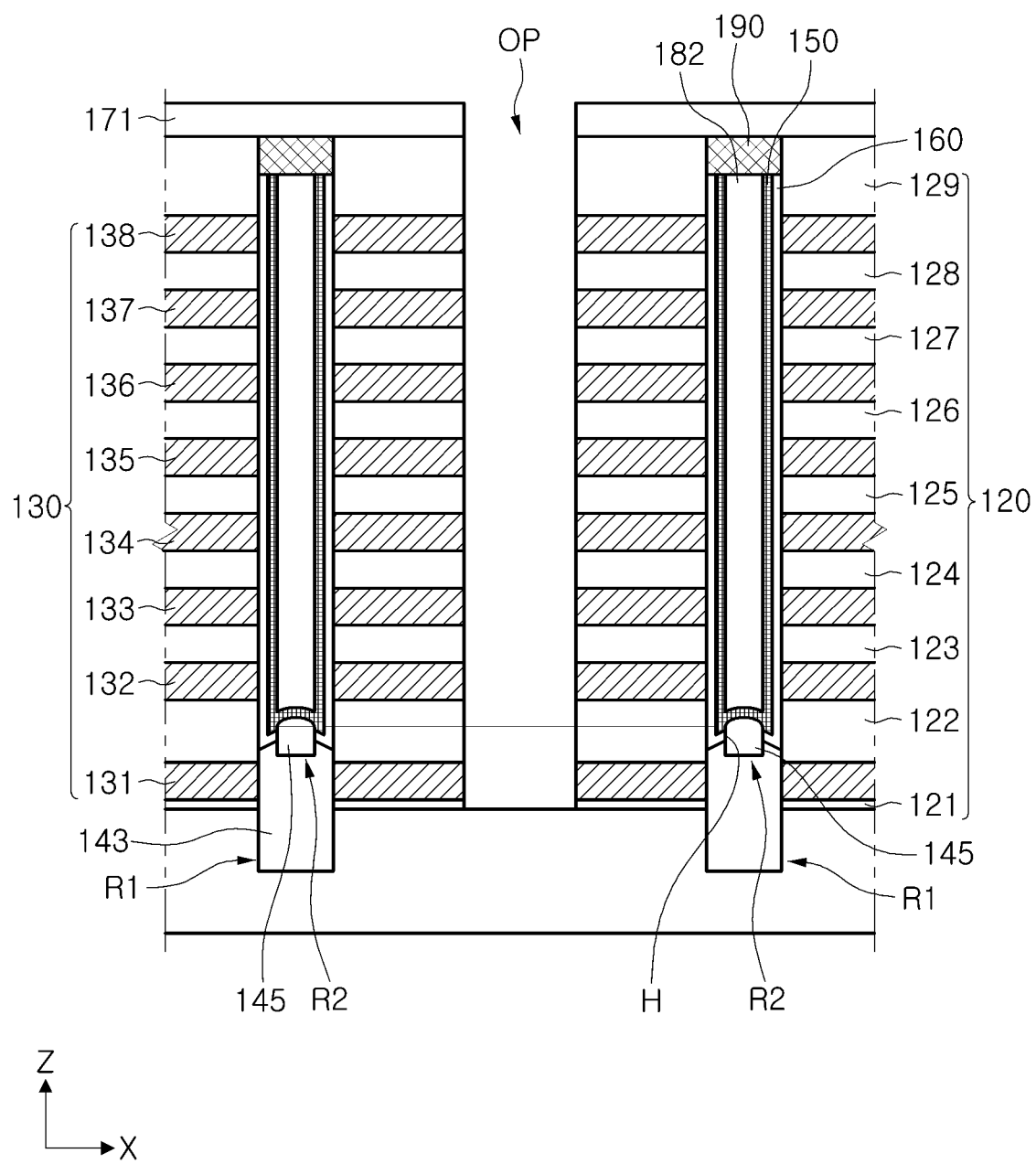

With reference to FIG. 10, gate electrode layers 130 may be formed in the lateral openings LP.

First, the gate electrode layers 130 may be formed to fill the lateral openings LP. A gate electrode layer 130 may include a metal, a metallic nitride, polycrystalline silicon, or a metallic silicide material. The metal may include W, Cu, Al, and the like. The metallic nitride may include WN, TaN, TiN, or combinations thereof.

Figure 11:
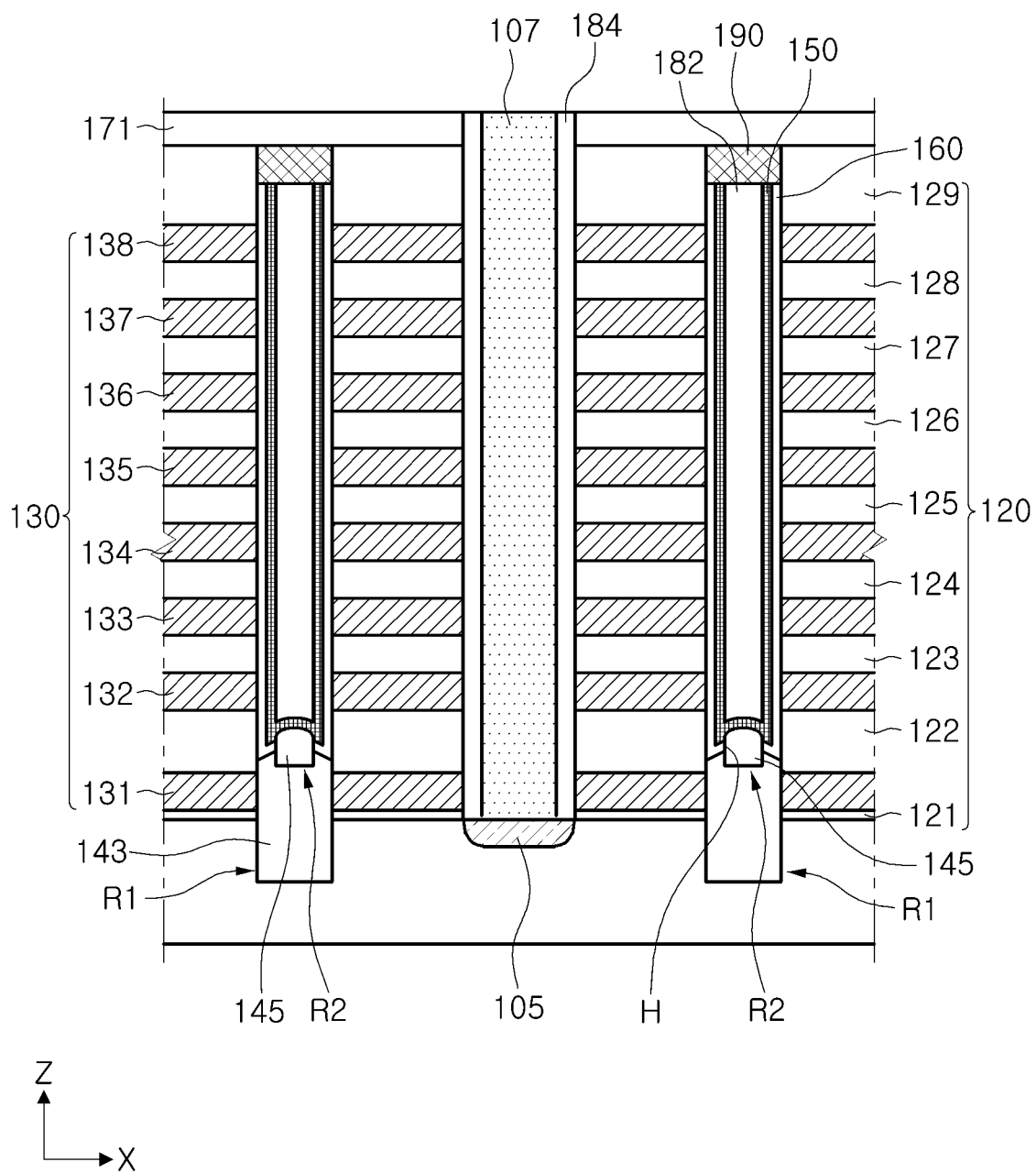

With reference to FIG. 11, an impurity region 105 may be formed in the substrate 101 in the opening OP, and the conductive layer 107 and a second insulating layer 184 may be formed on the impurity region 105.

First, an impurity may be injected into the substrate 101 exposed through the opening OP, thereby forming the impurity region 105. Subsequently, the second insulating layer 184 may be formed on a side wall of the opening OP, and the conductive layer 107 filling the opening OP may be formed.

In an example embodiment, the impurity region 105 may be formed after the second insulating layer 184 is formed. The impurity region 105 may be configured to include areas having different impurity concentrations.

Subsequently, a contact plug connected to the conductive pad 190 may be further disposed, and a bit line connected to the contact plug may be formed, which is not illustrated in FIG. 11.

Figure 12:
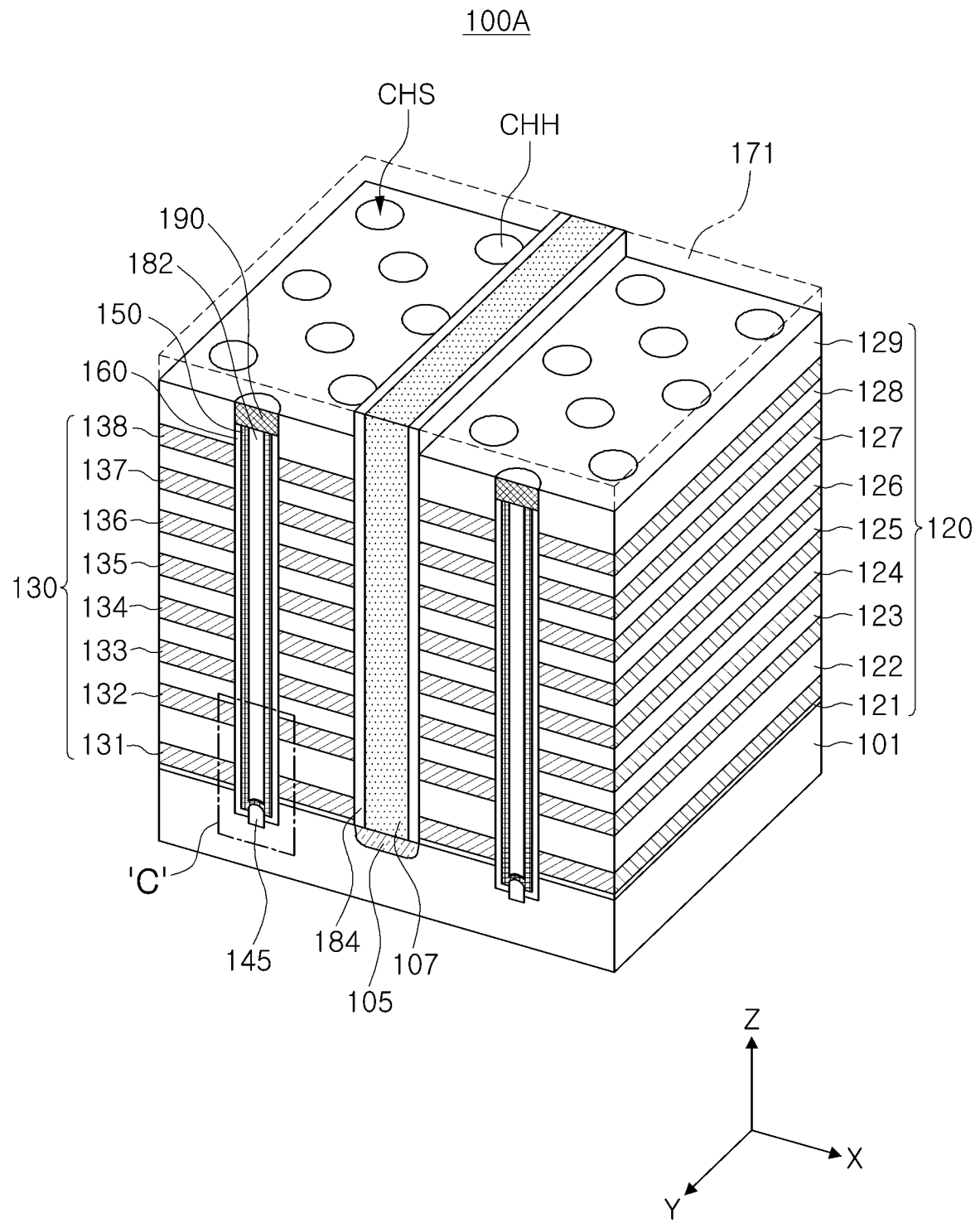
FIG. 12 is a schematic perspective view of a vertical memory device according to an example embodiment.
Figure 13A:
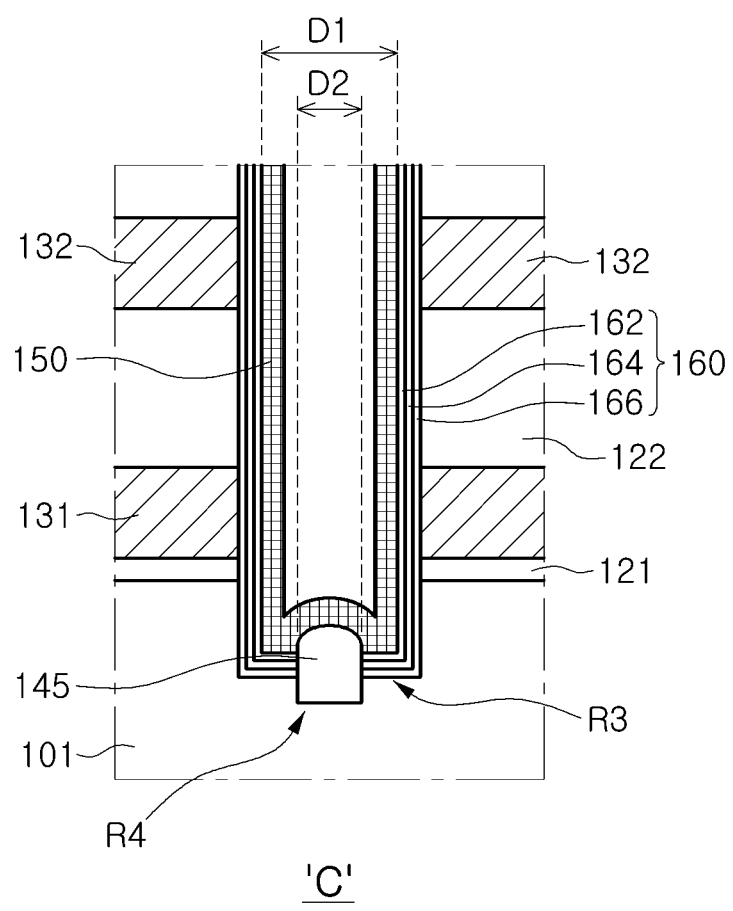
FIGS. 13A to 13E are cross-sectional views of an epitaxial layer according to example embodiments and illustrate an area corresponding to area 'C' of FIG. 12.

FIG. 12 is a schematic perspective view of a vertical memory device 100A according to an example embodiment. FIG. 13A is a cross-sectional view of an epitaxial layer of the vertical memory device 100A according to an example embodiment and illustrates an area corresponding to area 'C' of FIG. 12.

With reference to FIGS. 12 and 13A, the vertical memory device 100A is similar to the vertical memory device 100 described above, and like reference designators refer to like elements. For example, the vertical memory device 100A may include a substrate 101 and a plurality of channel layers 150 disposed in a direction perpendicular to an upper surface of the substrate 101. A plurality of mold insulating layers 120 and a plurality of gate electrode layers 130 may be alternately stacked along an external sidewall of channel layers 150. In addition, the vertical memory device 100A may further include a gate dielectric layer 160 disposed between gate electrode layers 130 and each of the channel layer 150. Additionally, a conductive layer 107, and a conductive pads 190 on the channel layers 150 may be provided.

The vertical memory device 100A may be different from a vertical memory device 100 illustrated with reference to FIGS. 1 and 2A, in that a lower epitaxial layer is not disposed between the channel layer 150 and the substrate 101. Thus, in an example embodiment, an upper epitaxial layer 145 is referred to as an epitaxial layer 145. Only descriptions thereof, different from previously provided descriptions of FIGS. 1 and 2A, will be provided below.

The gate dielectric layer 160 may be disposed between the gate electrode layers 130 and each of the channel layers 150. A lower surface portion of the gate dielectric layer 160 may have a "L"-shaped cross section, as shown in FIG. 13A. Gate dielectric layers 160 may be extended below the upper surface of the substrate 101, and a lower surface of the gate dielectric layers 160 may be formed in a position lower than the upper surface of the substrate 101 (i.e., in the −Z direction). The gate dielectric layer 160 may be disposed in a recessed region R3 of the substrate 101.

The substrate 101 may include a recessed region R4 in contact with the epitaxial layer 145. The epitaxial layer 145 may be formed on the recessed region R4 of the substrate 101.

The channel layer 150 may be electrically connected to the substrate 101 by the epitaxial layer 145.

The epitaxial layer 145 may be in contact with a lower portion of the channel layer 150 and may have a diameter (a width) D2, smaller than an external diameter D1 of the channel layer 150. The epitaxial layer 145 may fill a through hole H penetrating through the lower surface portion of the gate dielectric layer 160. The epitaxial layer 145 may penetrate through the gate dielectric layer 160 in a lower portion of the channel hole CHH and may have an upper surface protruding beyond the upper surface of the gate dielectric layer 160. The upper surface of the epitaxial layer 145 may have an upwardly convex curved surface. The epitaxial layer 145 may have a lower surface protruding beyond the lower surface of the gate dielectric layer 160. The lower surface of the epitaxial layer 145 may have a flat surface.

Thus, the epitaxial layer 145 is formed to fill the through hole H of the gate dielectric layer 160, thereby preventing a disconnection phenomenon of the channel layer 150 formed using a polycrystalline semiconductor. Thus, a structure described above may allow a thickness of the channel layer 150 to be reduced.

In a manner different from an example embodiment illustrated in FIGS. 12 and 13A, but similar to an example embodiment of FIG. 2C, the epitaxial layer 145 may fill only a portion of the through hole H.

FIGS. 13B to 13E are cross-sectional views of an epitaxial layer 145 according to example embodiments and illustrate areas corresponding to area 'C' of FIG. 12. Only descriptions of FIGS. 13B, 13C, 13D, and 13E, different from previously provided descriptions of FIG. 13A, will be provided.

Figure 13B:
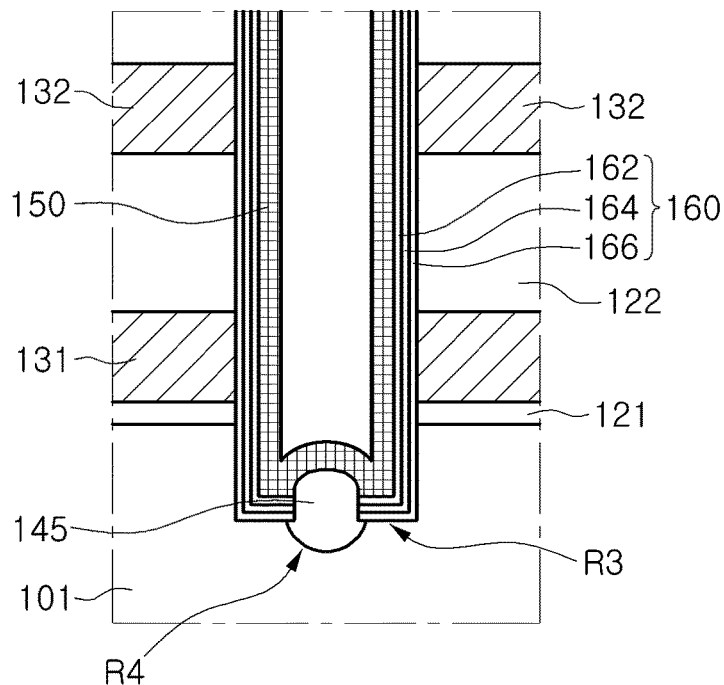

With reference to FIG. 13B, in a manner different from an example embodiment of FIG. 13A, a lower surface of the epitaxial layer 145 may have a downwardly convex curved surface. In other words, an upper portion of a substrate 101 may include a recessed region R4 in contact with the epitaxial layer 145 and having a concave curved surface. A diameter (a width) of an upper portion of the recessed region R4 in the substrate 101 may be greater than a diameter (a width) of the through hole H.

Figure 13C:
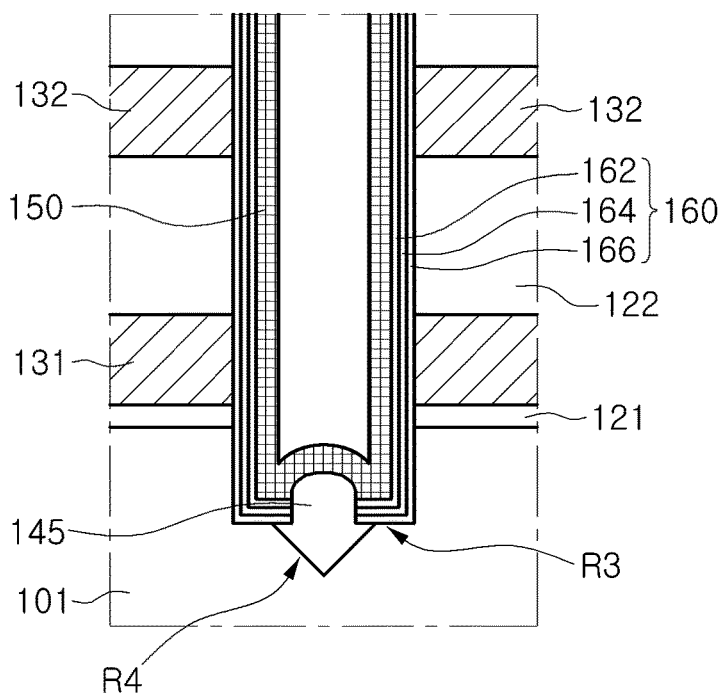

With reference to FIG. 13C, in a manner different from an example embodiment of FIG. 13A, the lower surface of the epitaxial layer 145 may be downwardly convex and have inclined surfaces. The lower surface of the epitaxial layer 145 may have a downwardly pointed cross section (e.g., an arrowhead-shaped cross section). In other words, the upper portion of the substrate 101 may include the recessed region R4 in contact with the epitaxial layer 145, being concave and having inclined surfaces. The diameter (the width) of the upper portion of the recessed region R4 in the substrate 101 may be greater than the diameter (the width) of the through hole H.

Figure 13D:
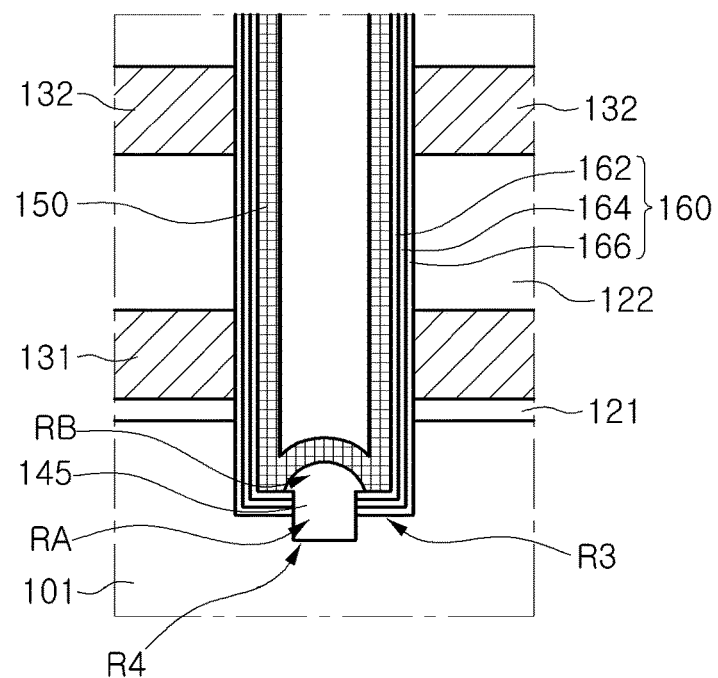

With reference to FIG. 13D, in a manner different from an example embodiment of FIG. 13A, the epitaxial layer 145 may include a first region RA penetrating through the gate dielectric layer 160 and a second region RB disposed on the first region and having a diameter (a width) greater than a diameter (a width) of the first region. An upper surface of the second region of the epitaxial layer 145 may have an upwardly convex curved surface.

Figure 13E:
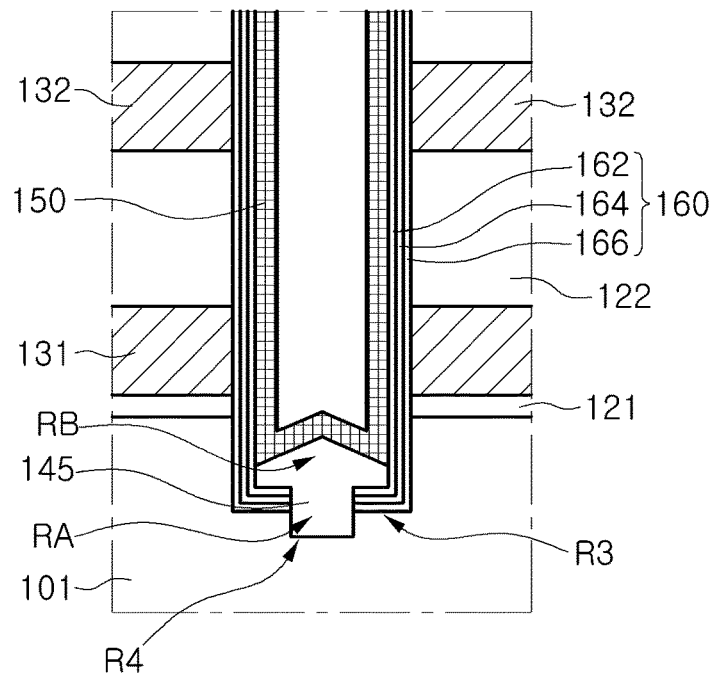

With reference to FIG. 13E, in a manner different from an example embodiment of FIG. 13A, the epitaxial layer 145 may include a first region RA penetrating through the gate dielectric layer 160 and a second region RB disposed on the first region and having the diameter (the width) greater than the diameter (the width) of the first region. The second region may be in contact a sidewall portion of the gate dielectric layer 160. The upper surface of the second region of the epitaxial layer 145 may be upwardly convex and have inclined surfaces.

Example embodiments of FIGS. 13A to 13E may be appropriately combined with each other.

FIGS. 14 to 17 are schematic views of main operations of a method of manufacturing a vertical memory device 100A according to an example embodiment.

Figure 14:
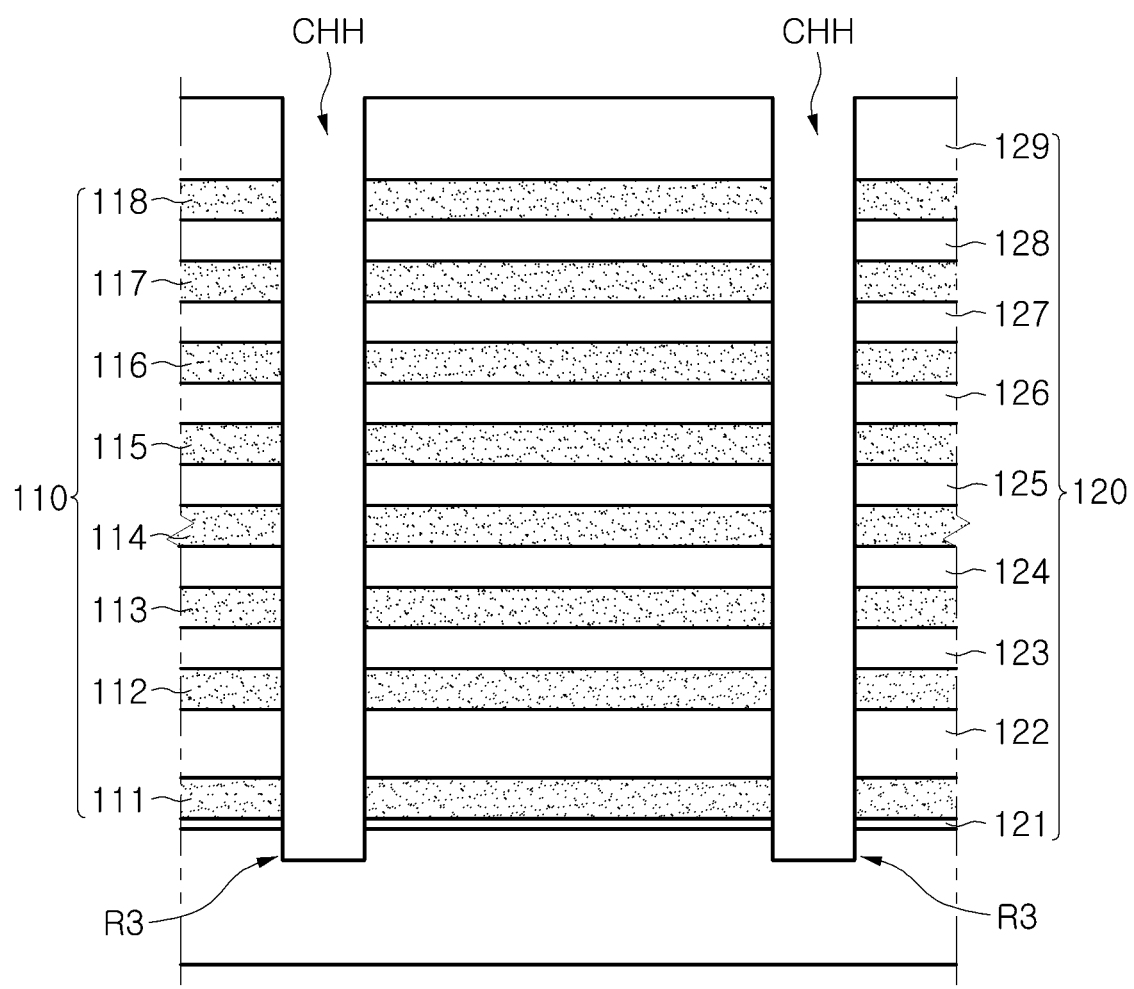
FIGS. 14 to 17 are schematic views of operations of a method of manufacturing a vertical memory device according to an example embodiment.

With reference to FIG. 14, sacrificial layers 110 and mold insulating layers 120 may be alternately stacked on a substrate 101. Hole-form channel holes CHH penetrating through the sacrificial layers 110 and the mold insulating layers 120 may be formed.

The channel holes CHH may be extended to the substrate 101 in a Z direction, thereby forming the recessed region R3 in the substrate 101.

Figure 15:
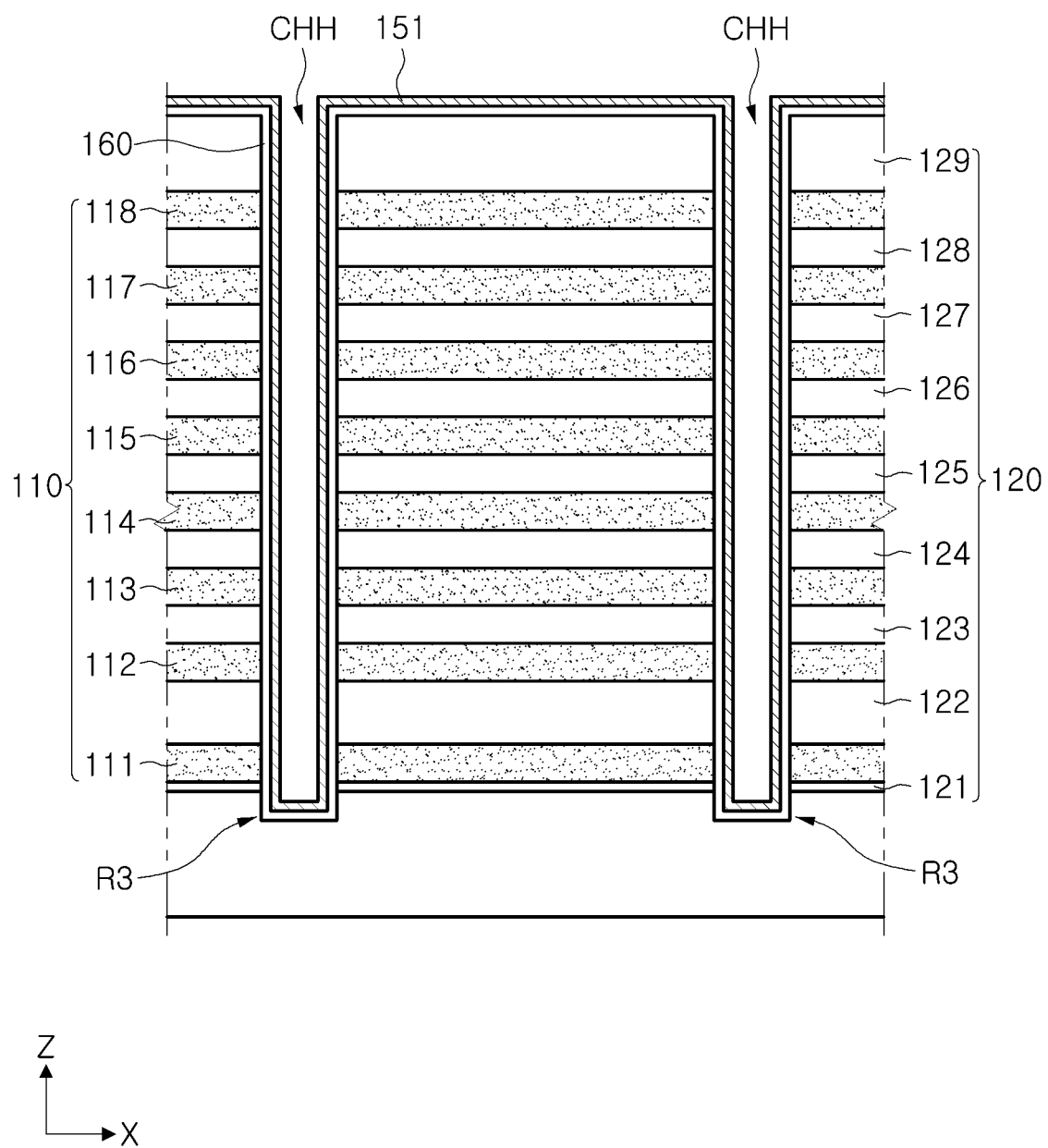

With reference to FIG. 15, a gate dielectric layer 160 and a sacrificial semiconductor layer 151 may be formed in channel holes CHH.

The gate dielectric layer 160 may be formed to have a uniform thickness on a side wall of the channel holes CHH, on an upper surface of the substrate 101 exposed in the channel holes CHH, and on an upper surface of the mold insulating layer 129. A lower surface of the gate dielectric layer 160 may be disposed to be lower than the upper surface of the substrate 101.

The sacrificial semiconductor layer 151 may be formed on the gate dielectric layer 160 to have a uniform thickness. The sacrificial semiconductor layer 151 may be formed using a semiconductor material, such as polycrystalline silicon and amorphous silicon.

Figure 16:
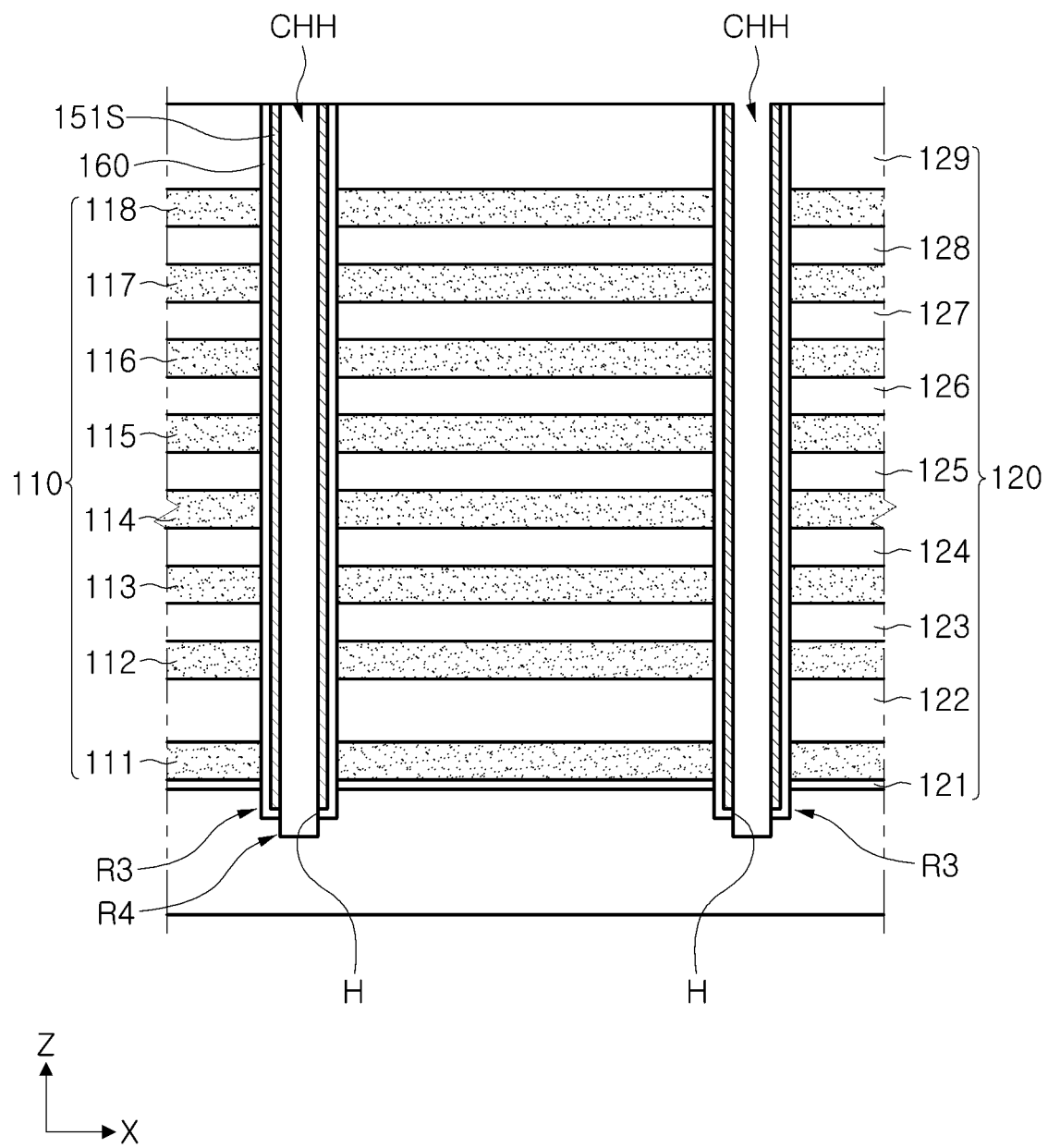

With reference to FIG. 16, in order to allow a channel layer 150 to be in direct contact with the substrate 101 in a subsequent process, a portion of the gate dielectric layer 160 may be removed from the channel holes CHH.

After the sacrificial semiconductor layer 151 is anisotropically etched, thereby forming a sacrificial spacer layer 151S formed on the side wall of the gate dielectric layer 160, an exposed gate dielectric layer 160 may be anisotropically etched using the sacrificial spacer layer 151S as an etching mask, in order to be selectively removed. A through hole H may be formed in a lower surface portion of the gate dielectric layer 160. The gate dielectric layer 160 may have a "L"-shaped cross section on the side wall of the channel hole CHH. An upper portion of the substrate 101 may be etched, thereby forming a recessed region R4 deeper than the recessed region R3.

Figure 17:
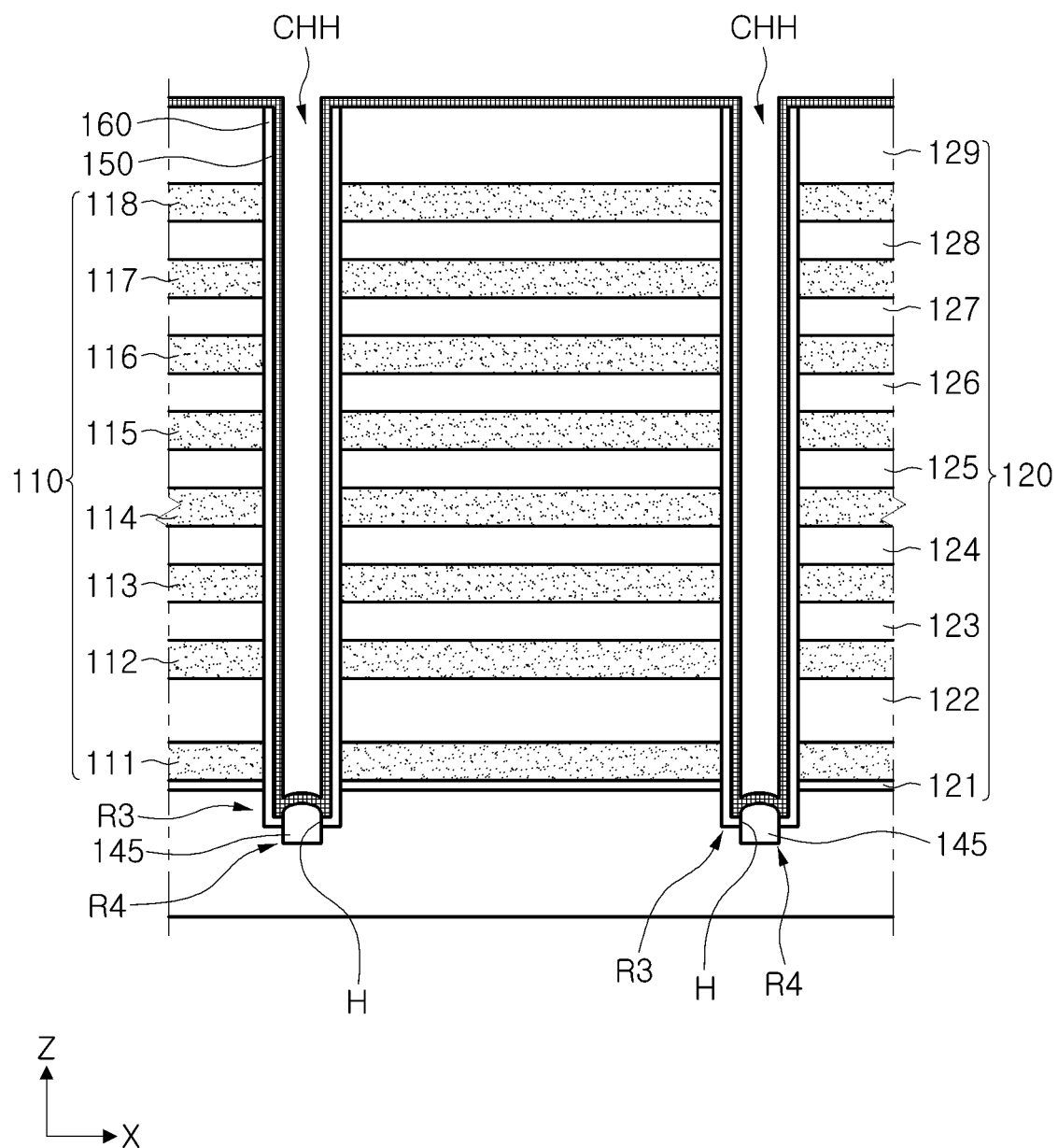

With reference to FIG. 17, an epitaxial layer 145 and a channel layer 150 may be formed in the channel holes CHH.

First, the sacrificial spacer layer 151S may be removed using a wet etching process.

The epitaxial layer 145 may be formed in such a manner that an SEG process is performed using the substrate 101 in a recessed region R2 as a seed. The epitaxial layer 145 may be formed to have a single layer structure or a multilayer structure including different growth conditions or compositions.

The epitaxial layer 145 may be doped with an impurity. The impurity may be provided as a conductive impurity the same as that in the substrate 101 or opposed thereto.

The epitaxial layer 145 may entirely fill the through hole H of the gate dielectric layer 160. In addition, an upper surface of the epitaxial layer 145 may be formed to have a convex shape in the opposite direction to the substrate 101. Alternatively, in some example embodiments, the upper surface of the epitaxial layer 145 may fill only a portion of the through hole H of the gate dielectric layer 160, as discussed above.

The channel layer 150 may be formed using a semiconductor material, such as polycrystalline silicon and amorphous silicon. The channel layer 150 may be formed to fill the recessed region R3 of the substrate 101. The channel layer 150 may be formed to be thicker than a final thickness, and then may be adjusted to have an ultimately desired thickness using a trimming process.

Subsequently, the vertical memory device 100A may be manufactured by performing processes described with reference to FIGS. 8 to 11.

Figure 18:
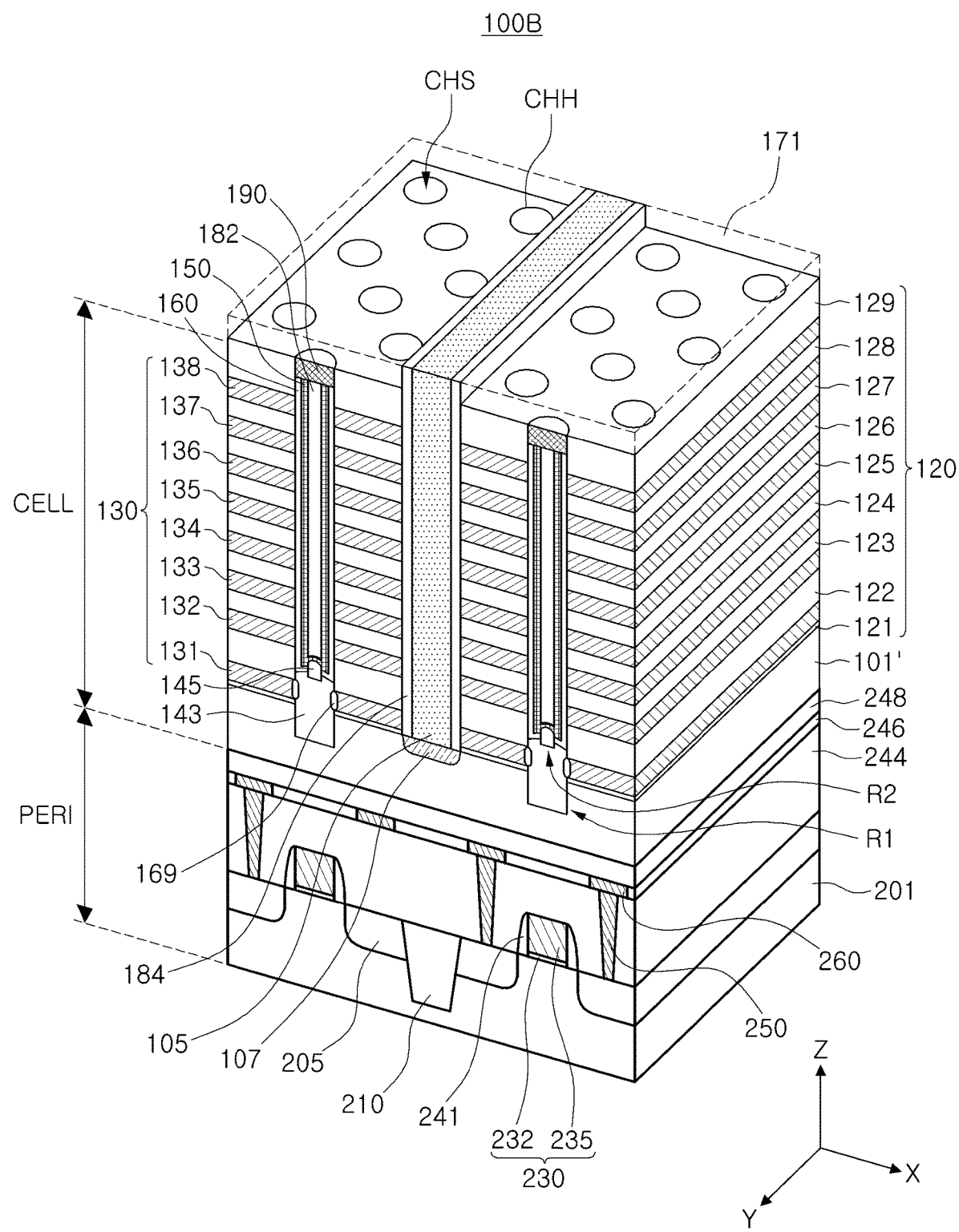
FIG. 18 is a schematic perspective view of a vertical memory device according to an example embodiment.

FIG. 18 is a schematic perspective view of a vertical memory device according to an example embodiment.

With reference to FIG. 18, a vertical memory device 100B may include a cell region CELL and a peripheral circuit region PERI.

The cell region CELL may correspond to an area in which a memory cell array is disposed, while the peripheral circuit region PERI may correspond to an area in which a driving circuit of the memory cell array is disposed. The cell region CELL may be disposed on the peripheral circuit region PERI. In an example embodiment, in a manner different from an example embodiment illustrated in FIG. 18, the cell region CELL may be disposed below the peripheral circuit region PERI.

The cell region CELL is similar to a structure illustrated in FIG. 1 and may include a substrate 101', a plurality of channel layers 150 disposed in a direction perpendicular to an upper surface of the substrate 101', and a plurality of mold insulating layers 120 and a plurality of gate electrode layers 130, alternately stacked along an external sidewall of the channel layers 150. In addition, the cell region CELL may include a lower epitaxial layer 143 and an upper epitaxial layer 145, disposed between a channel layer 150 and the substrate 101', a gate dielectric layer 160 disposed between the channel layer 150 and a gate electrode layer 130, a conductive layer 107 disposed on an impurity region 105, and a conductive pad 190 disposed on the channel layer 150.

In an example embodiment, the cell region CELL is illustrated as having a structure similar to that of an example embodiment of FIG. 1, but is not limited thereto. The cell region CELL may have a structure of various example embodiments of the present inventive concept described above or a structure in which example embodiments are combined.

The peripheral circuit region PERI may include a base substrate 201 and circuit elements 230, contact plugs 250, and wiring lines 260, disposed on the base substrate 201.

The base substrate 201 may have an upper surface extended in an X direction and a Y direction. An element separation layer 210 defined as an active region may be formed in the base substrate 201. A doped region 205 including an impurity may be disposed in a portion of the active region. The base substrate 201 may include a semiconductor material, such as a group IV semiconductor, a group III-V compound semiconductor, or a group II-VI compound semiconductor. For example, the group IV semiconductor may include Si, Ge or SiGe. The base substrate 201 may be provided as a bulk wafer or an epitaxial layer.

Each circuit element 230 may include a circuit gate insulating layer 232 and a circuit gate electrode 235. A spacer layer 241 may be disposed on a side wall of the circuit gate electrode 235. The doped region 205 may be disposed in the base substrate 201 on opposing sides of the circuit gate electrode 235 to function as a source region or a drain region of the circuit element 230. The circuit element 230 is not limited to an example embodiment illustrated therein and may include various types of field effect transistors.

A plurality of peripheral region insulating layers 244, 246, and 248 may be disposed on the base substrate 201 to cover the circuit element 230. A peripheral region insulating layer 244 may include a silicon oxide or a low-k dielectric material.

The contact plugs 250 may penetrate through the peripheral region insulating layer 244 to be connected to the doped region 205. An electrical signal may be applied to the circuit element 230 by the contact plugs 250.

In a region not illustrated, the contact plugs 250 may also be connected to the circuit gate electrode 235. The wiring lines 260 may be connected to the contact plugs 250 and, in an example embodiment, may be disposed to have a plurality of layers.

After the peripheral circuit region PERI is first formed, the cell region CELL may be manufactured. The substrate 101' may have the same size as that of the base substrate 201 or may be formed to be smaller than the base substrate 201. The substrate 101' may be formed using polycrystalline silicon. The substrate 101' may be formed using amorphous silicon, and then may be crystallized.

The cell region CELL may be connected to the peripheral circuit region PERI in a region not illustrated. In detail, an end of gate electrode layers 130 in the Y direction may be electrically connected to the circuit element 230.

Since the cell region CELL and the peripheral circuit region PERI are vertically disposed, the vertical memory device 100B of an example embodiment may be implemented to be a miniaturized device.

As set forth above, according to example embodiments of the present inventive concept, a vertical memory device preventing a disconnection phenomenon of a channel layer and having improved characteristics in transistors forming a memory cell string by reducing a thickness of the channel layer may be provided.

While example embodiments have been shown and described above, it will be apparent to those skilled in the art that modifications and variations could be made without departing from the scope of the present inventive concept as defined by the appended claims.

What is claimed is:

1. A vertical memory device comprising:
   a substrate;
   a plurality of gate electrode layers stacked on the substrate;
   a channel layer having a vertical portion and a connection portion extended from a lower end portion of the vertical portion, the vertical portion penetrating through the plurality of gate electrode layers;
   a first epitaxial layer between the connection portion and the substrate;
   a second epitaxial layer between the connection portion and the substrate; and
   a gate dielectric layer including a first portion and a second portion extended from an lower end of the first portion,
   wherein the first epitaxial layer is disposed between the second epitaxial layer and the connection portion of the channel layer,
   wherein a width of the second epitaxial layer is greater than a width of the first epitaxial layer,
   wherein the channel layer is a single layer,
   wherein the connection portion of the channel layer covers an entire upper surface of the first epitaxial layer,
   wherein the second epitaxial layer includes a sidewall and an upper surface,
   wherein the sidewall of the second epitaxial layer and the upper surface of the second epitaxial layer are connected at obtuse angle,
   wherein the first portion of the gate dielectric layer is disposed between the plurality of gate electrode layers and the vertical portion,
   wherein the second portion of the gate dielectric layer is disposed between the connection portion and the second epitaxial layer, and
   wherein a width of the connection portion is greater than the width of the first epitaxial layer.

2. The vertical memory device of claim 1, wherein the first epitaxial layer penetrates through at least a portion of the gate dielectric layer and has an upper surface protruding beyond the gate dielectric layer.

3. The vertical memory device of claim 1, wherein an upper surface of the first epitaxial layer has an upwardly convex curved surface.

4. The vertical memory device of claim 1, wherein an upper surface of the first epitaxial layer has inclined surfaces.

5. The vertical memory device of claim 1, wherein a lower surface of the first epitaxial layer has a downwardly convex curved surface.

6. The vertical memory device of claim 1, wherein a lower surface of the first epitaxial layer has inclined surfaces.

7. The vertical memory device of claim 2, wherein the first epitaxial layer comprises a first region penetrating entirely through the gate dielectric layer and having a first diameter, and a second region disposed on the first region and having a second diameter greater than the first diameter of the first region.

8. The vertical memory device of claim 1, wherein a first upper surface of the first epitaxial layer is disposed to be higher than a second upper surface of a lowermost gate electrode layer, among the plurality of gate electrode layers.

9. The vertical memory device of claim 1, wherein the single layer is in a singular in contact with the gate dielectric layer and the first epitaxial layer.

10. A vertical memory device comprising:
    a substrate;
    a plurality of gate electrode layers stacked on the substrate;
    a channel hole penetrating through the plurality of gate electrode layers;
    a channel layer extended in the channel hole in a vertical direction and having a vertical portion and a connection portion extended from an lower end portion of the vertical portion, the vertical portion penetrating through the plurality of gate electrode layers;
    a gate dielectric layer including a sidewall portion and a lower surface portion, the sidewall portion being disposed between the channel layer and the plurality of gate electrode layers, and the lower surface portion being bent in a lower portion of the channel hole to be disposed between the channel layer and the substrate; and
    a first epitaxial layer in contact with the channel layer and penetrating through the lower surface portion of the gate dielectric layer,
    wherein the channel layer covers an entire upper surface of the first epitaxial layer and the first epitaxial layer has a diameter smaller than an external diameter of the channel layer,
    wherein the first epitaxial layer includes a first portion protruding to be lower than the gate dielectric layer, a second portion disposed on the first portion and penetrating through the gate dielectric layer, and a third portion disposed on the second portion and between the second portion and the channel layer,
    wherein a width of the third portion is greater than a width of the second portion.

11. The vertical memory device of claim 10, wherein an upper surface of the first epitaxial layer and a lower surface of the first epitaxial layer have different forms.

12. The vertical memory device of claim 10, wherein the channel layer is a single layer, and
    wherein the single layer is in a singular in contact with the gate dielectric layer and the first epitaxial layer.

13. The vertical memory device of claim 10, wherein a width of the connection portion of the channel layer is equal to the width of the third portion of the first epitaxial layer.

14. A vertical memory device comprising:
    a substrate;

a plurality of gate electrode layers stacked on the substrate;

a channel hole penetrating through the plurality of gate electrode layers;

a gate dielectric layer covering an internal sidewall of the channel hole and bent in a lower portion of the channel hole;

a channel layer disposed on the gate dielectric layer extended in the channel hole in a vertical direction;

a through hole penetrating through the gate dielectric layer in the lower portion of the channel hole;

a first semiconductor layer filling at least a portion of the through hole and in contact with the channel layer; and a second semiconductor layer disposed between the first semiconductor layer and the substrate, wherein the channel layer covers an entire upper surface of the first semiconductor layer, wherein the first semiconductor layer has a diameter smaller than an external diameter of the channel layer, wherein the first semiconductor layer includes a first portion protruding to be lower than the gate dielectric layer, a second portion disposed on the first portion and penetrating through the gate dielectric layer, and a third portion disposed on the second portion and between the second portion and the channel layer, wherein a width of the first portion is greater than a width of the second portion.

15. The vertical memory device of claim 14, wherein the first semiconductor layer entirely fills the through hole, and an upper surface of the first semiconductor layer has an upwardly convex curved surface.

16. The vertical memory device of claim 14, wherein the first semiconductor layer entirely fills the through hole, and an upper surface of the first semiconductor layer has inclined surfaces.

17. The vertical memory device of claim 14, wherein the single layer is in a singular in contact with the gate dielectric layer and the first semiconductor layer.

\* \* \* \* \*